United States Patent
Yamauchi et al.

(10) Patent No.: US 10,524,355 B2
(45) Date of Patent: Dec. 31, 2019

(54) PRINTED CIRCUIT BOARD AND METHOD OF MANUFACTURING THE SAME

(71) Applicant: Nitto Denko Corporation, Ibaraki-shi, Osaka (JP)

(72) Inventors: Daisuke Yamauchi, Ibaraki (JP); Hiroyuki Tanabe, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 1 day.

(21) Appl. No.: 15/488,808

(22) Filed: Apr. 17, 2017

(65) Prior Publication Data
US 2017/0303390 A1   Oct. 19, 2017

(30) Foreign Application Priority Data

Apr. 18, 2016 (JP) .................. 2016-082857

(51) Int. Cl.
H05K 1/02 (2006.01)
H05K 1/11 (2006.01)
H05K 1/09 (2006.01)
H05K 3/46 (2006.01)

(52) U.S. Cl.
CPC ......... *H05K 1/0245* (2013.01); *H05K 1/0298* (2013.01); *H05K 1/09* (2013.01); *H05K 1/115* (2013.01); *H05K 3/4608* (2013.01); *H05K 3/4644* (2013.01)

(58) Field of Classification Search
CPC .. H05K 1/0298; H05K 1/0245; H05K 3/4608; H05K 3/4644
See application file for complete search history.

(56) References Cited

U.S. PATENT DOCUMENTS

| 2004/0070884 | A1 | 4/2004 | Someya et al. | |
|---|---|---|---|---|
| 2004/0246626 | A1* | 12/2004 | Wakaki | G11B 5/486 360/245.8 |
| 2006/0199402 | A1 | 9/2006 | Ishii et al. | |
| 2007/0133128 | A1* | 6/2007 | Arai | G11B 5/486 360/245.9 |
| 2008/0047739 | A1 | 2/2008 | Ishii et al. | |

(Continued)

FOREIGN PATENT DOCUMENTS

| JP | 2004133988 A | 4/2004 |
|---|---|---|
| JP | 2006245220 A | 9/2006 |

(Continued)

*Primary Examiner* — Hoa C Nguyen
*Assistant Examiner* — Amol H Patel
(74) *Attorney, Agent, or Firm* — Panitch Schwarze Belisario & Nadel LLP

(57) ABSTRACT

In a suspension board, a ground layer and a first insulating layer are formed on a support substrate. The ground layer has electric conductivity higher than that of the support substrate. A power wiring trace is formed on the first insulating layer. A second insulating layer is formed on the support substrate to cover the ground layer and the first insulating layer. A write wiring trace is formed on the second insulating layer to at least partially overlap with the ground layer. A distance between the ground layer and the write wiring trace in a stacking direction of the support substrate, the first insulating layer and the second insulating layer is set larger than a distance between the power wiring trace and the write wiring trace in the stacking direction.

11 Claims, 27 Drawing Sheets

(56) References Cited

U.S. PATENT DOCUMENTS

2008/0278858 A1 11/2008 Ishii et al.
2009/0316300 A1 12/2009 Kamei et al.

FOREIGN PATENT DOCUMENTS

| JP | 3891912 B2 | 3/2007 |
| JP | 2008034639 A | 2/2008 |
| JP | 2008282995 A | 11/2008 |
| JP | 4403090 B2 | 1/2010 |
| JP | 2010003893 A | 1/2010 |
| JP | 2012198950 A | 10/2012 |
| JP | 5139169 B2 | 2/2013 |

* cited by examiner

LINE A-A

LINE B-B

CROSS SECTION TAKEN
ALONG LINE C-C

LINE D-D

LINE A-A

LINE B-B

LINE D-D

LINE A-A

LINE B-B

LINE D-D

LINE A-A

LINE B-B

LINE D-D

LINE A-A

LINE B-B

LINE C-C

LINE A-A

LINE B-B

LINE D-D

LINE A-A

LINE B-B

LINE D-D

LINE A-A

LINE B-B

LINE D-D

LINE A-A

LINE B-B

LINE D-D

LINE J1-J1

FIG. 33B LINE J5-J5

FIG. 33C LINE J6-J6

PRINTED CIRCUIT BOARD AND METHOD OF MANUFACTURING THE SAME

BACKGROUND OF THE INVENTION

Field of the Invention

The present invention relates to a printed circuit board and a method of manufacturing the printed circuit board.

Description of Related Art

Conventionally, printed circuit boards have been used in various types of electric equipment and electronic equipment. In JP 2010-3893 A, a suspension board used for an actuator in a hard disc drive device is described as a printed circuit board.

In the printed circuit board described in JP 2010-3893 A, a first insulating layer is formed on a suspension main body. First and second wiring traces are formed on the first insulating layer to be spaced apart from each other and be in parallel to each other. Two second insulating layers are formed in two regions on the first insulting layer such that the first wiring trace and the second wiring trace are positioned between the two second insulating layers. A third wiring trace is formed in a region on the second insulating layer close to the second wiring trace, and a fourth wiring trace is formed in a region on the second insulating layer close to the first wiring trace.

The first wiring trace and the third wiring trace are connected to each other in a predetermined location, so that a first write wiring trace is constituted. The second wiring trace and the fourth wiring trace are connected to each other in a predetermined location, so that a second write wiring trace is constituted. The first write wiring trace and the second write wiring trace constitute a signal line pair.

In the printed circuit board described in JP 2010-3893 A, the first and second wiring traces are formed at positions lower than the third and fourth wiring traces. Therefore, as compared to the case where the first to fourth wiring traces are formed on the same plane, a distance between the first and third wiring traces, a distance between the second and fourth traces, and a distance between the second and third traces are respectively increased. This reduces the proximity effect among the first to fourth wiring traces. Thus, a loss of electric signals transmitted through the first to fourth wiring traces is reduced.

BRIEF SUMMARY OF THE INVENTION

However, in recent years, electric signals used in electric equipment or electronic equipment have higher frequencies. Therefore, a further reduction in transmission loss of an electric signal in a high frequency band in the printed circuit board is required.

An object of the present invention is to provide a printed circuit board in which a loss of an electric signal is reduced in a high frequency band. A further object is to provide a method of manufacturing the printed circuit board.

(1) A printed circuit board according to one aspect of the present invention includes a support substrate formed of a conductive material, a ground layer that is formed on the support substrate and has electric conductivity higher than that of the support substrate, a first insulating layer formed on the support substrate, a lower wiring trace formed on the first insulating layer, a second insulating layer formed on the first insulating layer to cover the ground layer and the lower wiring trace, and an upper wiring trace formed on the second insulating layer to overlap with the ground layer, wherein a distance between the ground layer and the upper wiring trace is larger than a distance between the lower wiring trace and the upper wiring trace in a stacking direction of the support substrate, the first insulating layer and the second insulating layer.

In the printed circuit board, the ground layer and the first insulating layer are formed on the support substrate. The lower wiring trace is formed on the first insulating layer. Further, the second insulating layer is formed on the support substrate to cover the ground layer and the first insulating layer. Further, the upper wiring trace is formed on the second insulating layer to overlap with the ground layer. In this case, an electric signal can be transmitted through each of the lower wiring trace and the upper wiring trace.

In the case where an electric signal having a high frequency band is transmitted through the upper wiring trace, electromagnetic waves are generated from the upper wiring trace. When the electromagnetic wave enters the support substrate or the ground layer, an eddy current is generated in the support substrate or the ground layer, and the upper wiring trace and one of the support substrate and the ground layer are electromagnetically coupled to each other. This generates the loss, corresponding to the magnitude of the eddy current generated in the support substrate or the ground layer, of the electric signal transmitted through the upper wiring trace. The larger the eddy current is, the larger the loss of the electric signal is. Further, the smaller the eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer has the electric conductivity higher than that of the support substrate. Therefore, an eddy current generated in the ground layer by electromagnetic waves is smaller than an eddy current generated in the support substrate by electromagnetic waves.

In the above-mentioned configuration, because the ground layer is positioned between at least part of the upper wiring trace and the support substrate, the electromagnetic waves radiated from the upper wiring trace towards the support substrate at least partially enter the ground layer and does not reach the support substrate. Further, the larger the distance between the ground layer and the upper wiring trace is, the smaller the eddy current generated in the ground layer is. In the above-mentioned configuration, the distance between the ground layer and the upper wiring trace in the stacking direction is larger than the distance between the lower wiring trace and the upper wiring trace in the stacking direction. Therefore, as compared to the case where the ground layer is formed on the first insulating layer, the eddy current generated in the ground layer is reduced. This results in the reduced loss of the electric signal transmitted through the upper wiring trace in a high frequency band.

(2) The first insulating layer may be formed in a region on the support substrate in which the ground layer is not formed, and the second insulating layer may be formed to come into contact with the ground layer.

(3) The first insulating layer may have a portion extending between the ground layer and the second insulating layer, and the extending portion may be formed to come into contact with the ground layer.

In this case, the ground layer is formed on the support substrate, and then the first insulating layer can be formed on the entire support substrate to cover the ground layer. Therefore, it is not necessary to perform patterning on the first insulating layer when the first insulating layer is formed on the support substrate.

(4) A first opening may be formed in the support substrate, a second opening overlapping with the first opening of the support substrate may be formed in the ground layer, and the upper wiring trace at least partially may overlap with the second opening of the ground layer.

A value of the characteristic impedance of the upper wiring trace is determined according to an area of portions in which the upper wiring trace overlaps with each of the support substrate and the ground layer. In the above-mentioned configuration, the first and second openings are formed in the support substrate and the ground layer. Therefore, it is possible to easily adjust the value of the characteristic impedance of the upper wiring trace by adjusting the size and the number of the first and second openings.

(5) The first and second openings may be formed such that, in the case where the printed circuit board is viewed in the stacking direction, an inner edge of the second opening surrounds an inner edge of the first opening, and the inner edge of the second opening may be covered by the first or second insulating layer.

In this case, the inner edge of the second opening of the ground layer is not exposed between the support substrate and one of the first and second insulating layers to outside of the printed circuit board. Therefore, the ground layer is prevented from eroding from the inner edge of the second opening.

(6) The upper wiring trace may extend in a first direction, and a plurality of the second openings may be intermittently formed in the ground layer to be arranged in the first direction.

In this case, the plurality of first openings are intermittently arranged in the first direction together with the plurality of second openings. Thus, the uniformity of the characteristic impedance of the upper wiring trace can be improved.

(7) The printed circuit board may further include first and second vias that penetrate at least one of the first and second insulating layers, wherein the support substrate may include a support portion electrically connected to the ground layer and a wiring portion electrically insulated from the support portion, the upper wiring trace may include first and second signal lines that constitute a signal line pair, the first signal line may include first and second branch lines, the second signal line may include third and fourth branch lines electrically connected to each other, the first and second branch lines of the first signal line and the third and fourth branch lines of the second signal line may be arranged such that any one of the first and second branch lines is positioned between the third and fourth branch lines, and may be arranged such that any one of the third and fourth branch lines is positioned between the first and second branch lines, the first via may electrically connect part of the first branch line of the first signal line to the wiring portion of the support substrate, and the second via may electrically connects a remaining portion of the first branch line of the first signal line to the wiring portion of the support substrate.

In the above-mentioned configuration, part of the first branch line and a remaining portion of the first branch line of the first signal line are electrically connected to each other through the first via, the wiring portion and the second via. Thus, the first branch line is formed on the second insulating layer such that the part of the first branch line and the remaining portion of the first branch line are spaced apart from each other.

In this state, the third or fourth branch line can be formed on the second insulating layer to pass between the part of the first branch line and the remaining portion of the first branch line. Therefore, the first and second branch lines and the third and fourth branch lines can be arranged on the second insulating layer such that any one of the first and second branch lines is positioned between the third and fourth branch lines, and can be arranged on the second insulating layer such that any one of the third and fourth branch lines is positioned between the first and second branch lines.

The first and second branch lines and the third and fourth branch lines are arranged such that any one of the first and second branch lines is positioned between the third and fourth branch lines, and are arranged such that any one of the third and fourth branch lines is positioned between the first and second branch lines. Thus, three side surfaces among one side surface and another side surface of the first branch line and one side surface and another side surface of the second branch line face three side surfaces among one side surface and another side surface of the third branch line and one side surface and another side surface of the fourth branch line. Thus, an area in which the first signal line and the second signal line are opposite to each other is increased, so that the capacitance of the upper wiring trace is increased. This results in reduced characteristics impedance of each of the first and second signal lines.

(8) The printed circuit board may further include a relay trace formed on the first insulating layer, and first and second vias that penetrate the second insulating layer, wherein the upper wiring trace may include first and second signal lines that constitute a signal line pair, the first signal line may include first and second branch lines, the second signal line may include third and fourth branch lines electrically connected to each other, the first and second branch lines of the first signal line and the third and fourth branch lines of the second signal line may be arranged such that any one of the first and second branch lines is positioned between the third and fourth branch lines, and may be arranged such that any one of the third and fourth branch lines is positioned between the first and second branch lines, the first via may electrically connect part of the first branch line of the first signal line to the relay trace, and the second via may electrically connect a remaining portion of the first branch line of the first signal line to the relay trace.

In the above-mentioned configuration, the part of the first branch line and the remaining portion of the first branch line of the first signal line are electrically connected to each other through the first via, the relay trace and the second via. Thus, the first branch line can be formed on the second insulating layer such that the part of the first branch line and the remaining portion of the first branch line are spaced apart from each other. Further, the third or fourth branch line can be formed on the second insulating layer to pass between the part of the first branch line and the remaining portion of the first branch line. Therefore, the first and second branch lines and the third and fourth branch lines can be arranged on the second insulating layer such that any one of the first and second branch lines is positioned between the third and fourth branch lines, and can be arranged on the second insulating layer such that any one of the third and fourth branch lines is positioned between the first and second branch lines.

The first and second branch lines and the third and fourth branch lines are arranged such that any one of the first and second branch lines is positioned between the third and fourth branch lines, and are arranged such that any one of the third and fourth branch lines is positioned between the first and second branch lines. Thus, three side surfaces among one side surface and another side surface of the first branch line and one side surface and another side surface of the second branch line face three side surfaces among one side surface and another side surface of the third branch line and one side surface and another side surface of the fourth branch line. Thus, an area in which the first signal line and the second signal line are opposite to each other is increased, so that the capacitance of the upper wiring trace is increased. This results in reduced characteristic impedance of the first and second signal lines.

(9) The support substrate may include stainless steel, and the ground layer includes copper.

In this case, sufficient rigidity of the support substrate required to support the upper wiring trace and the lower wiring trace can be ensured by stainless steel. Further, a passive film is formed on the surface of the stainless steel. Thus, deterioration of the support substrate due to erosion is inhibited. Copper has electric conductivity higher than that of stainless steel. Thus, an eddy current generated in the ground layer by the electromagnetic waves can be reduced.

(10) The printed circuit board may further include a third insulating layer formed on the second insulating layer to cover the upper wiring trace. In this case, the upper wiring trace is protected by the third insulating layer.

(11) A method of manufacturing a printed circuit board according to another aspect of the present invention includes the steps of forming a ground layer having electric conductivity higher than that of a support substrate on the support substrate formed of a conductive material, forming a first insulating layer on the support substrate, forming a lower wiring trace on the first insulating layer, forming a second insulating layer on the first insulating layer to cover the ground layer and the lower wiring trace, and forming an upper wiring trace on the second insulating layer to overlap with the ground layer, wherein the step of forming the ground layer and the lower wiring trace includes forming the ground layer and the lower wiring trace such that a distance between the ground layer and the upper wiring trace is larger than a distance between the lower wiring trace and the upper wiring trace in a stacking direction of the support substrate, the first insulating layer and the second insulating layer.

In the printed circuit board acquired by this method of manufacturing, the ground layer is positioned between at least part of the upper wiring trace and the support substrate, so that a large part of electromagnetic waves radiated from the upper wiring trace towards the support substrate does not reach the support substrate and is shielded by the ground layer. Further, the larger the distance between the ground layer and the upper wiring trace is, the smaller the eddy current generated in the ground layer is. In the above-mentioned configuration, the distance between the ground layer and the upper wiring trace in the stacking direction is large as compared to the case where the ground layer is formed on the first insulating layer. Therefore, the eddy current generated in the ground layer is reduced as compared to the case where the ground layer is formed on the first insulating layer. This results in the reduced loss of the electric signal transmitted through the upper wiring trace in a high frequency band.

(12) The step of forming the first insulating layer may include forming the first insulating layer in a region on the support substrate in which the ground layer is not formed, and the step of forming the second insulating layer may include forming the second insulating layer to come into contact with the ground layer.

(13) The step of forming the first insulating layer may include forming the first insulating layer to extend between the ground layer and the second insulating layer and come into contact with the ground layer.

In this case, the ground layer is formed on the support substrate, and then the first insulating layer can be formed on the entire support substrate to cover the ground layer. Therefore, it is not necessary to perform patterning on the first insulating layer when the first insulating layer is formed on the support substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 33B is a cross sectional view taken along the line J5-J5 of FIG. 33A;

FIG. 33C is a cross sectional view taken along the line J6-J6 of FIG. 33A; and

DESCRIPTION OF THE PREFERRED EMBODIMENTS

A printed circuit board and a method of manufacturing the printed circuit board according to one embodiment of the present invention will be described below with reference to drawings. A suspension board having a circuit (hereinafter abbreviated as a suspension board) used for an actuator of a hard disc drive device will be described as the printed circuit board according to the one embodiment of the present invention.

[1] First Embodiment (1) Structure of Suspension Board

Figure 1:
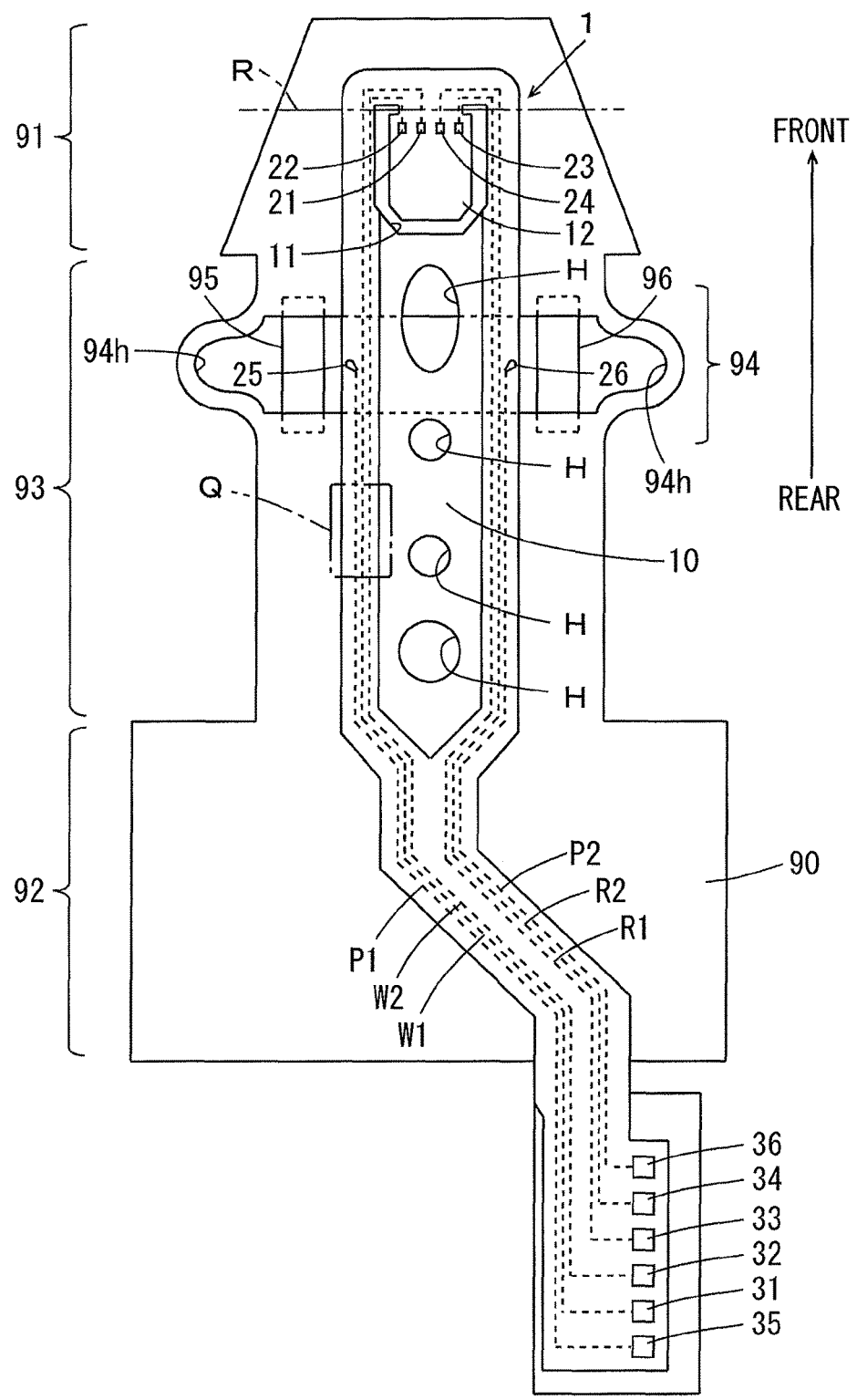
FIG. 1 is a plan view of a suspension board according to a first embodiment.

FIG. 1 is a plan view of the suspension board according to the first embodiment. In FIG. 1, a direction in which an arrow is directed is referred to as forward, and the opposite direction is referred to as rearward. As shown in FIG. 1, the suspension board 1 includes a support substrate 10 made of stainless steel, for example, as a suspension main body. In FIG. 1, the support substrate 10 extends in a substantially front-and-rear direction.

The suspension board 1 is supported by an elongated support plate 90. As indicated by dotted lines in FIG. 1, write wiring traces W1, W2, read wiring traces R1, R2 and power wiring traces P1, P2 are formed on the suspension board 1. Each of the write wiring traces W1, W2 and the read wiring traces R1, R2 is a high frequency line for allowing an electric signal having a high frequency band to be transmitted therethrough. Each of the power wiring traces P1, P2 is a low frequency line for allowing an electric signal, having a frequency band lower than that of the electric signal transmitted through each of the write wiring traces W1, W2 and the read wiring traces R1, R2, to be transmitted therethrough.

At a tip end of the support substrate 10, a magnetic head supporting portion (hereinafter referred to as a tongue) 12 is provided by forming a U-shaped opening 11. The tongue 12 is bent along a one-dot and dash line R to form a predetermined angle with the support substrate 10.

Four connection terminals 21, 22, 23, 24 are formed on an upper surface of the tongue 12 at one end of the support substrate 10. Further, two connection terminals 25, 26 are respectively formed on both sides in the vicinity of a center portion of the support substrate 10 in a direction in which the support substrate 10 extends (the front-and-rear direction). A head slider (not shown) having a magnetic head is mounted on the upper surface of the tongue 12. Terminals of the magnetic head of the head slider are connected to the connection terminals 21 to 24 of the tongue 12. The connection terminals 25, 26 are respectively connected to two piezoelectric elements 95, 96, described below.

Six connection terminals 31, 32, 33, 34, 35, 36 are formed on an upper surface at the other end of the support substrate 10. Electric circuits such as a preamplifier are connected to the connection terminals 31 to 34. Power circuits for the piezoelectric elements 95, 96 are connected to the connection terminals 35, 36. The connection terminals 21 to 26 are respectively electrically connected to the connection terminals 31 to 36 by the write wiring traces W1, W2, the read wiring traces R1, R2 and the power wiring traces P1, P2. Further, a plurality of holes H are formed in the center portion of the support substrate 10.

The support plate 90 has a front end region 91, a rear end region 92 and a center region 93. The rear end region 92 is rectangular. The front end region 91 is trapezoidal, and its width is gradually reduced forward. The center region 93 has a rectangular shape extending in the front-and-rear direction, and is arranged between the front end region 91 and the rear end region 92. With the suspension board 1 supported by an upper surface of the support plate 90, an end portion of the suspension board 1 including the connection terminals 31 to 36 projects rearward from the rear end region 92.

A piezoelectric element mounting region 94 is provided in one portion of the center region 93. The piezoelectric element mounting region 94 overlaps with the connection terminals 25, 26 of the suspension board 1. Both of side portions of the piezoelectric element mounting region 94 project to be curved outward. Further, a through hole 94h extending in a width direction (a direction orthogonal to the front-and-rear direction) is formed in the piezoelectric element mounting region 94. In this configuration, the piezoelectric element mounting region 94 of the support plate 90 is stretchable in the front-and-rear direction.

The piezoelectric elements 95, 96 are mounted on a lower surface of the piezoelectric element mounting region 94 so as to cross the through hole 94h. The piezoelectric elements 95, 96 are respectively positioned on both sides of the suspension board 1. The piezoelectric elements 95, 96 are respectively connected to the connection terminals 25, 26 of the suspension board 1 through the through hole 94h.

A voltage is added to the piezoelectric element 95 through the connection terminals 25, 35 and the power wiring trace P1, and a voltage is added to the piezoelectric element 96 through the connection terminals 26, 36 and the power wiring trace P2. Thus, with a stretch of the piezoelectric elements 95, 96, the support plate 90 is stretched in the front-and-rear direction. It is possible to subtly position the magnetic head of the head slider on the suspension board 1 by controlling the voltages added to the piezoelectric elements 95, 96.

The suspension board 1 supported by the support plate 90 is provided in the hard disc device. An electric current flows in the pair of write wiring traces W1, W2 at a time of writing the information in a magnetic disc. The write wiring trace W1 and the write wiring trace W2 constitute a differential signal line pair through which differential write signals are transmitted. Further, an electric current flows in the pair of read wiring traces R1, R2 at a time of reading the information from the magnetic disc. The read wiring trace R1 and the read wiring trace R2 constitute a differential signal line pair through which differential read signals are transmitted.

(2) Write Wiring Traces and Power Wiring Trace

Figure 2:
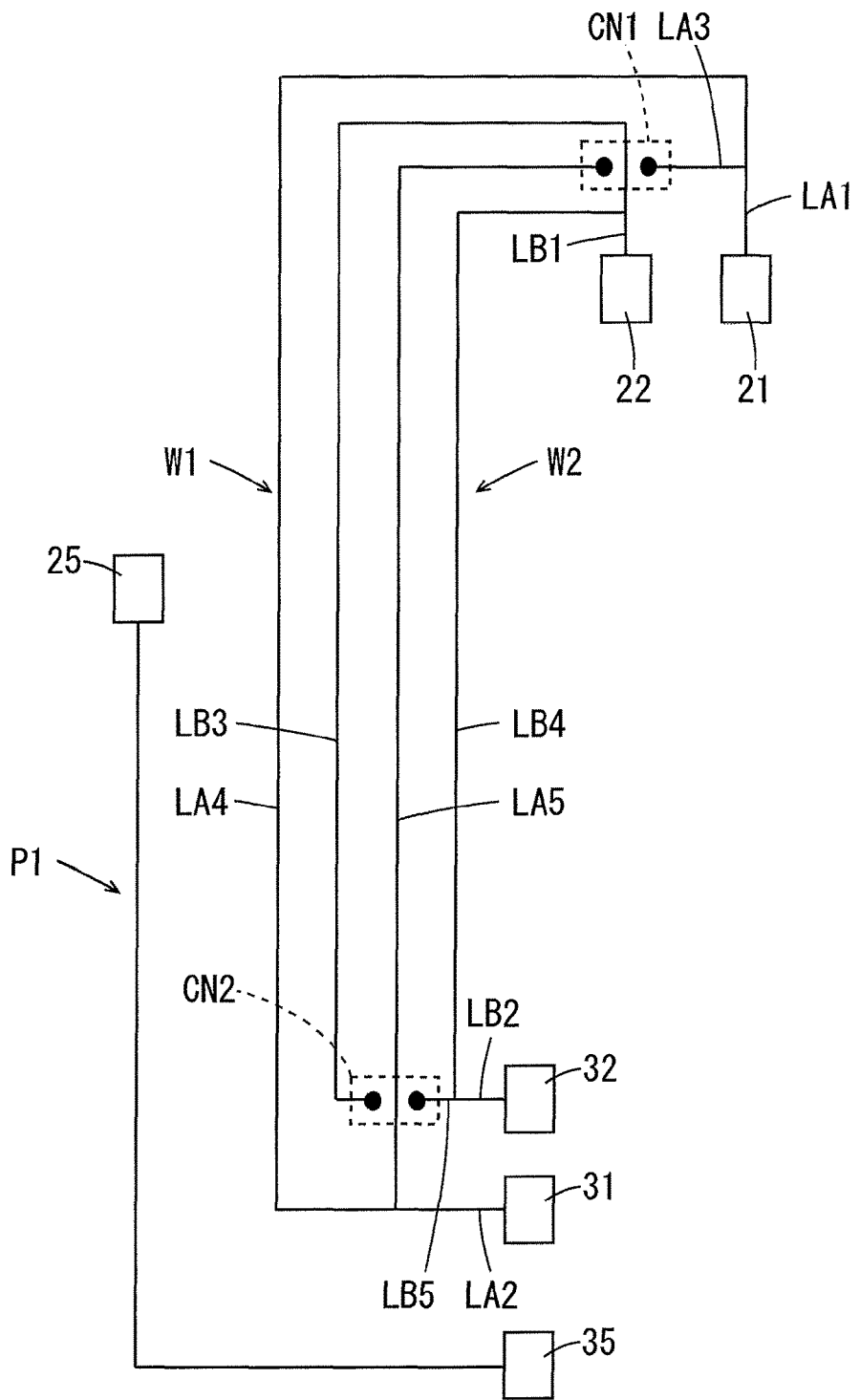
FIG. 2 is a schematic diagram showing configurations of a write wiring trace and a power wiring trace of FIG. 1.

Configurations of the write wiring traces W1, W2 and the power wiring trace P1 will be described. FIG. 2 is a schematic diagram showing the configurations of the write wiring traces W1, W2 and the power wiring trace P1 of FIG. 1.

As shown in FIG. 2, the write wiring trace W1 is constituted by lines LA1 to LA5. One end of the line LA1 is connected to the connection terminal 21, and one end of the line LA2 is connected to the connection terminal 31. One end of each of the lines LA3, LA4 is integrated with the other end of the line LA1. The other end of the line LA3 and one end of the line LA5 are electrically connected to each other in an intersection region CN1. Details of the intersection region CN1 will be described below. The other end of each of the lines LA4, LA5 is integrated with the other end of the line LA2.

The write wiring trace W2 is constituted by lines LB1 to LB5. One end of the line LB1 is connected to the connection terminal 22, and one end of the line LB2 is connected to the connection terminal 32. One end of each of the lines LB3, LB4 is integrated with the other end of the line LB1. The other end of the line LB3 and one end of the line LB5 are electrically connected to each other in an intersection region CN2. Details of the intersection region CN2 will be described below. The other end of each of the lines LB4, LB5 is integrated with the other end of the line LB2.

The lines LA4, LA5 of the write wiring trace W1 and the lines LB3, LB4 of the write wiring trace W2 are arranged to be in parallel to each other such that any of the lines LA4, LA5 is positioned between the lines LB3, LB4, and are arranged to be in parallel to each other such that any of the lines LB3, LB4 is arranged between the lines LA4, LA5. The line LA5 of the write wiring trace W1 extends to pass through a portion between the ends of the lines LB3, LB5 of the write wiring trace W2 in the intersection region CN2, and the line LB3 of the write wiring trace W2 extends to pass through a portion between the ends of the lines LA3, LA5 of the write wiring trace W1 in the intersection region CN1.

The power wiring trace P1 is provided at a position spaced apart from the write wiring traces W1, W2 to connect the two connection terminals 25, 35 to each other.

Figure 3:
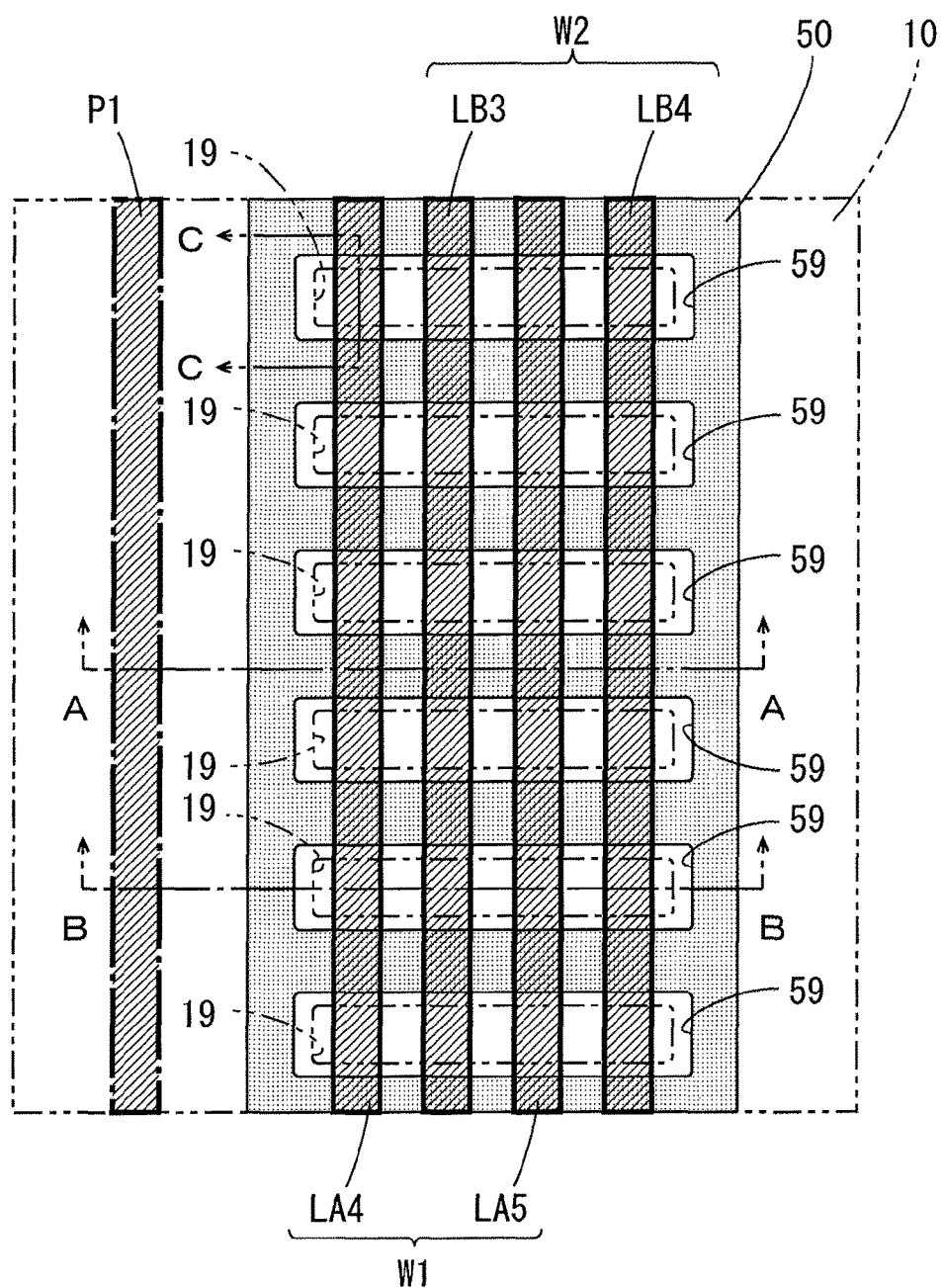
FIG. 3 is an enlarged plan view of a portion surrounded by a one-dot and dash line of the suspension board of FIG. 1.
Figure 4:
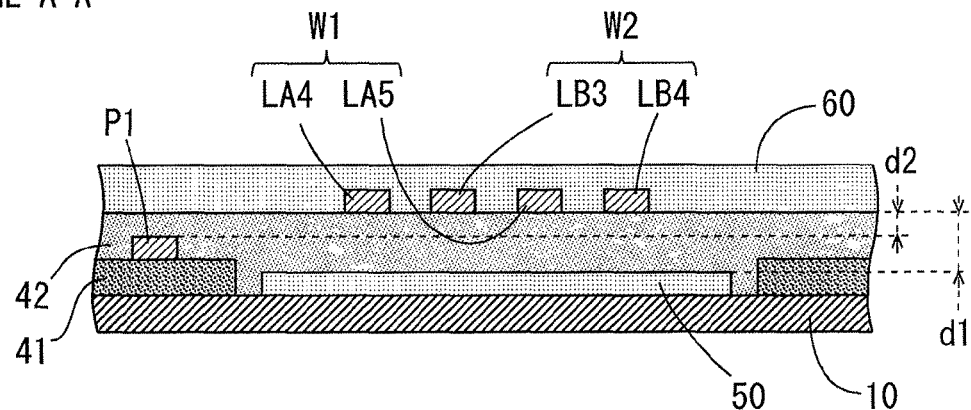
FIG. 4 is a cross sectional view taken along the line A-A of FIG. 3.
Figure 5:
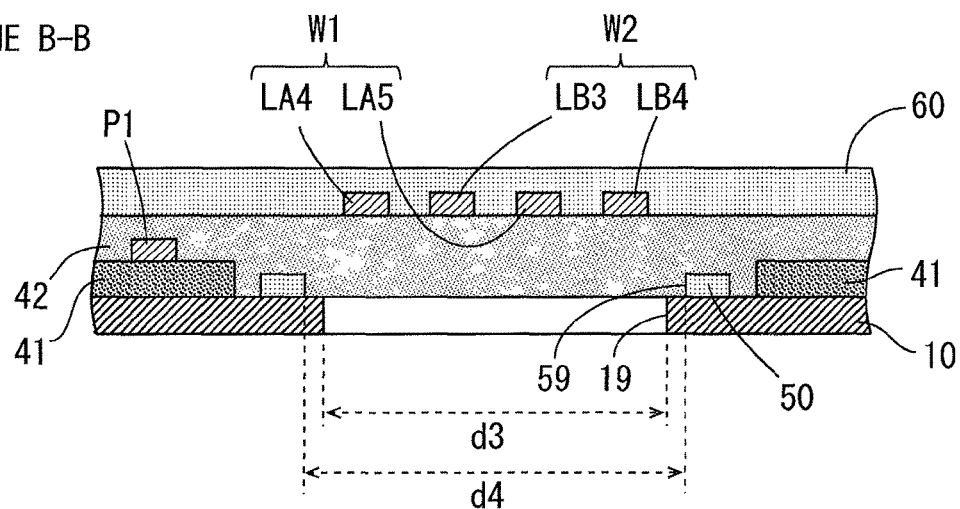
FIG. 5 is a cross sectional view taken along the line B-B of FIG. 3.
Figure 6:
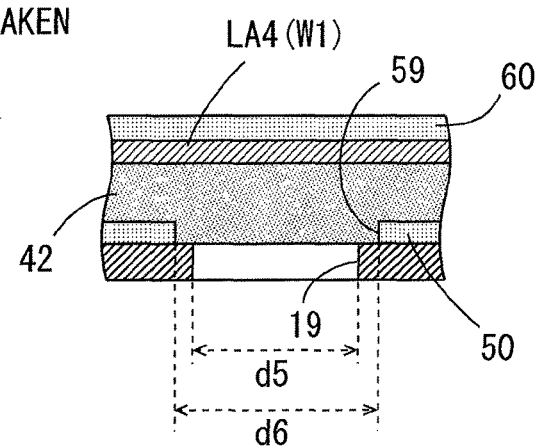
FIG. 6 is a cross sectional view taken along the line C-C of FIG. 3.

FIG. 3 is an enlarged plan view of a portion Q surrounded by a one-dot and dash line of the suspension board 1 of FIG. 1, FIG. 4 is a cross sectional view taken along the line A-A of FIG. 3, FIG. 5 is a cross sectional view taken along the line B-B of FIG. 3, and FIG. 6 is a cross sectional view taken along the line C-C of FIG. 3. As shown in FIG. 3, in the portion Q of FIG. 1, the lines LA4, LA5, LB3, LB4 of the write wiring traces W1, W2 and the power wiring trace P1 are formed to be arranged in a direction orthogonal to the front-and-rear direction.

As shown in FIG. 4, a ground layer 50 having electric conductivity higher than that of the support substrate 10 is formed on a partial region of the support substrate 10. As a material for the ground layer 50, copper is used, for example. In the case where the support substrate 10 is made of stainless steel, gold or silver may be used as the material for the ground layer 50. Alternatively, an alloy that includes any of gold, silver and copper and has electric conductivity higher than that of the stainless steel may be used as the material for the ground layer 50. The ground layer 50 may have a multilayer structure. For example, in the case where the support substrate 10 is made of stainless steel, the ground layer 50 may have a two-layer structure in which a nickel layer or a silver layer is stacked on a copper layer or a three-layer structure in which a nickel layer and a gold layer are stacked on a copper layer. In the case where the ground layer 50 has the multilayer structure including a copper layer, another metal layer such as a nickel layer, a silver layer, a gold layer or the like may be formed on an upper surface and a side surface of the copper layer to cover the surfaces of the copper layer.

A first insulating layer 41 made of polyimide, for example, is formed on a region in which the ground layer 50 of the support substrate 10 is not formed. The power wiring trace P1 is formed on the first insulating layer 41 as a lower wiring trace of the present invention. As a material for the power wiring trace P1, copper is used, for example. Surfaces of the power wiring trace P1 may be covered by a nickel layer, a silver layer or the like.

A second insulating layer 42 made of polyimide, for example, is formed on the first insulating layer 41 to cover the ground layer 50 and the power wiring trace P1. In the present example, the second insulating layer 42 is formed to further come into contact with the ground layer 50.

The lines LA4, LA5, LB3, LB4 of the write wiring traces W1, W2 are formed on the second insulating layer 42 as upper wiring traces of the present invention. Each of the lines LA4, LA5, LB3, LB4 of the write wiring traces W1, W2 at least partially overlaps with the ground layer 50. As a material for the write wiring traces W1, W2, copper is used, for example. A third insulating layer 60 made of polyimide, for example, is formed on the second insulating layer 42 to cover the write wiring traces W1, W2. Surfaces of the write wiring traces W1, W2 may be covered by a nickel layer, a silver layer or the like.

In the above-mentioned configuration, in a stacking direction of the support substrate 10, the first insulating layer 41 and the second insulating layer 42 (hereinafter referred to as a substrate stacking direction), a distance d1 between the ground layer 50 and the write wiring trace W1 is set larger than a distance d2 between the power wiring trace P1 and the write wiring trace W1.

In FIG. 3, the first insulating layer 41, the second insulating layer 42 and the third insulating layer 60 of FIG. 4 are not shown. Further, in FIG. 3, the write wiring traces W1, W2 are indicated by thick solid lines and hatching, the power wiring trace P1 is indicated by a thick one-dot and dash line and hatching, and the ground layer 50 is indicated by a solid line and a dotted pattern. Further, the support substrate 10 is indicated by a two-dots and dash line.

In the case where an electric signal having a high frequency band is transmitted through each of the write wiring traces W1, W2, electromagnetic waves are generated from each of the write wiring traces W1, W2. When the generated electromagnetic waves enter the support substrate 10 or the ground layer 50, an eddy current is generated in the support substrate 10, and each of the write wiring traces W1, W2 is electromagnetically coupled to the support substrate 10 or the ground layer 50. The loss, corresponding to the magnitude of the eddy current generated in the support substrate 10 or the ground layer 50, of the electric signal transmitted through each of the write wiring traces W1, W2 is generated. The larger the generated eddy current is, the larger the loss of the electric signal is. Further, the smaller the generated eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer 50 has the electric conductivity higher than that of the support substrate 10. Therefore, an eddy current generated in the ground layer 50 by electromagnetic waves is smaller than an eddy current generated in the support substrate 10 by electromagnetic waves.

In the above-mentioned configuration, because the ground layer 50 is positioned between at least part of the write wiring traces W1, W2 and the support substrate 10, electromagnetic waves radiated from each of the write wiring traces W1, W2 towards the support substrate 10 at least partially enter the ground layer 50 and do not reach the support substrate 10. Further, the larger a distance between the ground layer 50 and each of the write wiring traces W1, W2 is, the smaller an eddy current generated in the ground layer 50 is. In the above-mentioned configuration, the distance d1 (FIG. 4) between the ground layer 50 and each of the write wiring traces W1, W2 in the substrate stacking direction is larger than the distance d2 (FIG. 4) between the power wiring trace P1 and the write wiring trace W1 in the substrate stacking direction. Therefore, an eddy current generated in the ground layer 50 is reduced as compared to the case where the ground layer 50 is formed on the first insulating layer 41. This results in the reduced loss of the electric signal transmitted through each of the write wiring traces W1, W2 in a high frequency band.

A value of characteristic impedance of each of the write wiring traces W1, W2 is determined according to an area in which each of the write wiring traces W1, W2 overlaps with the support substrate 10 and the ground layer 50. For example, as compared to the case where the write wiring trace W1 partially overlaps with the support substrate 10 and the ground layer 50, in the case where the entire write wiring trace W1 overlaps with the support substrate 10 and the ground layer 50, a value of characteristic impedance of the write wiring trace W1 is smaller. Further, as compared to the case where the write wiring trace W1 does not overlap with the support substrate 10 and the ground layer 50, in the case where the write wiring trace W1 partially overlaps with the support substrate 10 and the ground layer 50, a value of characteristic impedance is smaller.

Then, in the present embodiment, the area in which each of the write wiring traces W1, W2 overlaps with the support substrate 10 and the ground layer 50 is adjusted such that a value of characteristic impedance of each of the write wiring traces W1, W2 approaches a desired value. Specifically, as shown in FIGS. 3, 5 and 6, a plurality of first openings 19 that overlap with each of the write wiring traces W1, W2 are formed in the support substrate 10 according to the preset impedance. Further, a plurality of second openings 59 that respectively overlap with the plurality of first openings 19 are formed in the ground layer 50.

The plurality of first openings 19 and the plurality of second openings 59 are basically intermittently formed to be arranged in a direction in which each of the write wiring traces W1, W2 extends. Thus, the uniformity of the characteristic impedance of each of the write wiring traces W1, W2 can be improved.

Depending on the set impedance, the plurality of first openings 19 and the plurality of second openings 59 do not have to be respectively formed in the support substrate 10 and the ground layer 50. Alternatively, depending on the set impedance, only one first opening 19 and one second opening 59 may be formed in the support substrate 10 and the ground layer 50.

As shown in FIG. 3, each first opening 19 and each second opening 59 that overlap with each other are formed such that, in the case where the suspension board 1 is viewed in the substrate stacking direction, an inner edge of the second opening 59 surrounds an inner edge of the first opening 19. In this case, as shown in FIG. 5, in a direction orthogonal to each of the write wiring traces W1, W2, a dimension d4 of each second opening 59 of the ground layer 50 is larger than a dimension d3 of the corresponding first opening 19 of the support substrate 10. Further, as shown in FIG. 6, in a direction in parallel to the write wiring traces W1, W2, a dimension d6 of each second opening 59 of the ground layer 50 is larger than a dimension d5 of the corresponding first opening 19 of the support substrate 10.

This configuration causes an inner edge of each second opening 59 of the ground layer 50 to be covered by the second insulating layer 42. Thus, the inner edge of each second opening 59 of the ground layer 50 is not exposed between the second insulating layer 42 and the support substrate 10 to the outside of the suspension board 1. Therefore, the ground layer 50 is prevented from eroding from the inner edge of each second opening 59.

Figure 7:
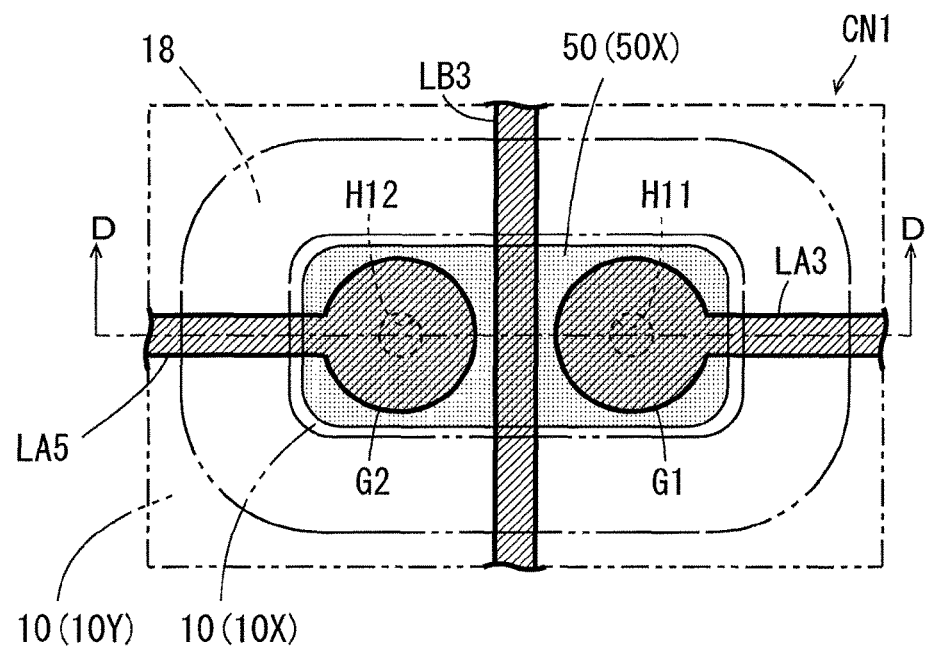
FIG. 7 is an enlarged plan view of an intersection region of FIG. 2.
Figure 8:
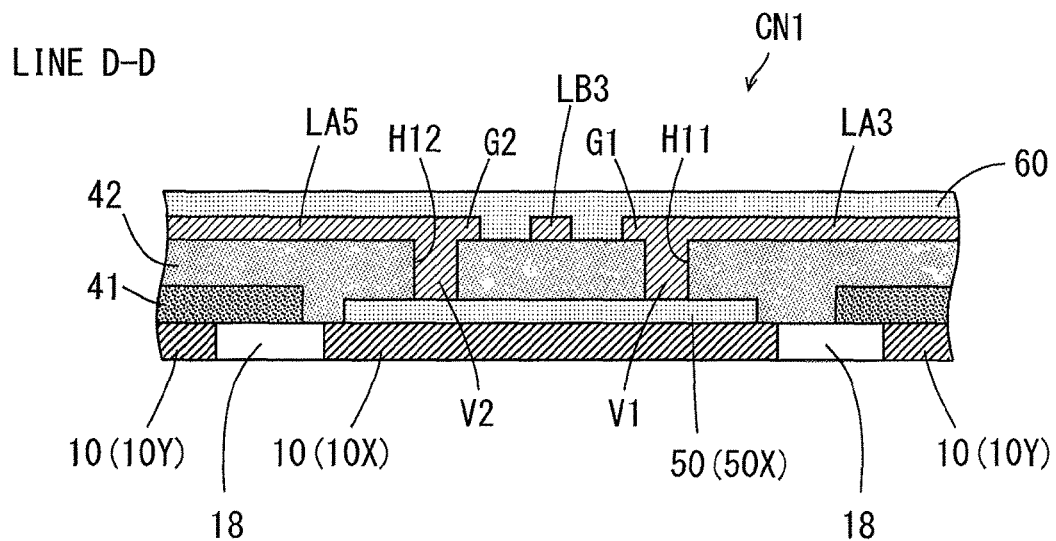
FIG. 8 is a cross sectional view taken along the line D-D of FIG. 7.

FIG. 7 is an enlarged plan view of the intersection region CN1 of FIG. 2, and FIG. 8 is a cross sectional view taken along the line D-D of FIG. 7. In FIG. 7, the first insulating layer 41, the second insulating layer 42 and the third insulating layer 60 of FIG. 4 are not shown. Further, in FIG. 7, the lines LA3, LA5 of the write wiring trace W1 (FIG. 2) and the line LB3 of the write wiring trace W2 (FIG. 2) are indicated by thick solid lines and hatching. Further, the ground layer 50 is indicated by a solid line and a dotted pattern. Further, the support substrate 10 is indicated by a two-dots and dash line. The intersection region CN2 of FIG. 2 has the configuration similar to that of the intersection region CN1.

As shown in FIGS. 7 and 8, an annular opening 18 is formed in a portion of the support substrate 10 in which the intersection region CN1 is formed. Thus, an insular portion electrically separated from other portions is formed in part of the support substrate 10. In the following description, an insular portion of the support substrate 10 is referred to as a first intersection wiring portion 10X, and a portion of the support substrate 10 except for the first intersection wiring portion 10X is referred to as a support portion 10Y. The first intersection wiring portion 10X and the support portion 10Y are electrically separated from each other by the annular opening 18.

The ground layer 50 is formed on the first intersection wiring portion 10X. In the following description, a portion of the ground layer 50 formed on the first intersection wiring portion 10X is referred to as a second intersection wiring portion 50X.

The line LB3 of the write wiring trace W2 is arranged to extend and pass through a position over the first intersection wiring portion 10X and the second intersection wiring portion 50X, and the other end of the line LA3 and the one end of the line LA5 of the write wiring trace W1 are arranged on both sides of the line LB3.

Circular connection portions G1, G2 are respectively provided at the other end of the line LA3 and the one end of the line LA5. Further, through holes H11, H12 are respectively formed in portions of the second insulating layer 42 below the connection portions G1, G2.

The connection portion G1 comes into contact with a second intersection wiring portion 50X in the through hole H11. The connection portion G2 comes into contact with the second intersection wiring portion 50X in the through hole H12. A via V1 is formed of a portion of the connection portion G1 in the through hole H11, and a via V2 is formed of a portion of the connection portion G2 in the through hole H12. Thus, the lines LA3, LA5 are electrically connected to each other through the vias V1, V2, the first intersection wiring portion 10X and the second intersection wiring portion 50X.

The shape of the connection portions G1, G2 is not limited to a circle and may be another shape such as an oval, a triangular, a square, a form of a sector or the like. Further, the transverse cross sectional shape of each of the through holes H11, H12 may be a circle, or may be another shape such as an oval, a triangular, a square, a shape of a sector or the like.

In this manner, in the present embodiment, the line LA3 and the line LA5 are electrically connected to each other through the vias V1, V2 in the intersection region CN1, the first intersection wiring portion 10X and the second intersection wiring portion 50X. Further, the line LB3 (FIG. 2) and the line LB5 (FIG. 2) are electrically connected to each other through the vias V1, V2 in the intersection region CN2 (FIG. 2), the first intersection wiring portion 10X and the second intersection wiring portion 50X.

Thus, the lines LA4, LA5 of the write wiring trace W1 of FIG. 2 and the lines LB3, LB4 of the write wiring trace W2 of FIG. 2 can be arranged without the interference between the write wiring trace W1 and the write wiring trace W2 such that any one of the lines LA4, LA5 is positioned between the lines LB3, LB4, and can be arranged without the interference between the write wiring trace W1 and the write wiring trace W2 such that any one of the lines LB3, LB4 is positioned between the lines LA4, LA5.

In the above-mentioned configuration, three side surfaces among one side surface and another side surface of the line LA4 and one side surface and another side surface of the line LA5 face three side surfaces among one side surface and another side surface of the line LB3 and one side surface and another side surface of the line LB4. This increases an area in which the write wiring traces W1, W2 are opposite to each other, thus increasing the capacitance of each of the write wiring traces W1, W2. This results in reduced characteristic impedance of each of the write wiring traces W1, W2.

Each of the read wiring traces R1, R2 of FIG. 1 is formed of one line, for example, on the second insulating layer 42 of FIG. 4. Alternatively, similarly to the above-mentioned configuration of each of the write wiring traces W1, W2, each of the read wiring traces R1, R2 may be formed of a plurality of lines configured to allow an electric signal to branch therein and be transmitted therethrough.

(3) Method of Manufacturing Suspension Board

The method of manufacturing the suspension board 1 will be described. FIGS. 9A to 14C are schematic cross sectional views for illustrating steps in the method of manufacturing the suspension board 1 of FIG. 1. In diagrams of FIGS. 9A to 14C, each of FIGS. 9A, 10A, 11A, 12A, 13A and 14A corresponds to a cross sectional view taken along the line A-A of FIG. 3, each of FIGS. 9B, 10B, 11B, 12B, 13B and 14B corresponds to a cross sectional view taken along the line B-B of FIG. 3, and each of FIGS. 9C, 100, 110, 12C, 13C and 14C corresponds to a cross sectional view taken along the line D-D of FIG. 7. The steps of forming the tongue 12, the plurality of connection terminals 21 to 26, 31 to 36, the plurality of holes H, the read wiring traces R1, R2 and the power wiring trace P2 of FIG. 1 will not be described.

Figure 9A:
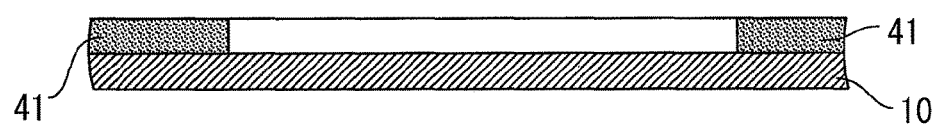
FIGS. 9A to 9C are schematic cross sectional views illustrating steps in a method of manufacturing the suspension board of FIG. 1.
Figure 9B:
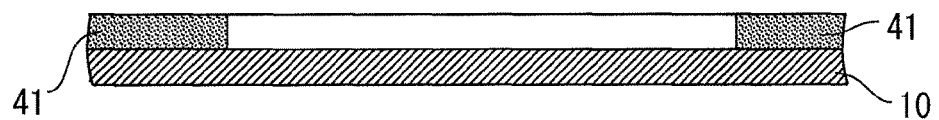
Figure 9C:
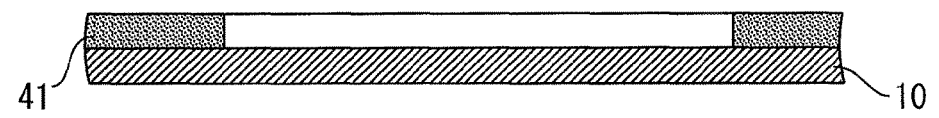

First, an elongated substrate made of stainless steel is prepared as the support substrate 10. Subsequently, as shown in FIGS. 9A to 9C, the first insulating layer 41 made of polyimide is formed on the prepared support substrate 10. The thickness of the support substrate 10 is not less than 8 μm and not more than 100 μm, for example. The thickness of the first insulating layer 41 is not less than 1 μm and not more than 25 μm, for example.

In the upper surface of the support substrate 10, a first region in which the ground layer 50 of FIG. 3 is to be formed, a plurality of second regions in which the plurality of first openings 19 of FIG. 3 are to be formed, and a third region in which the annular opening 18 of FIG. 7 is to be formed are determined in advance. The first insulating layer 41 is formed on a region except for the first and second regions in a range defined by an outer edge of the suspension board 1 of FIG. 1.

Figure 10A:
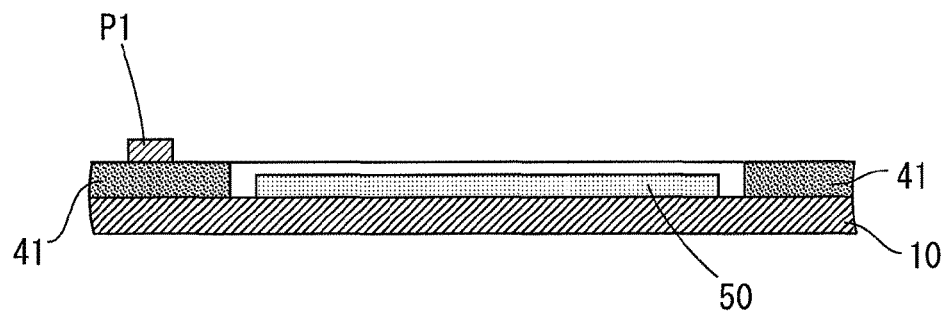
FIGS. 10A to 10C are schematic cross sectional views illustrating steps in the method of manufacturing the suspension board of FIG. 1.
Figure 10B:
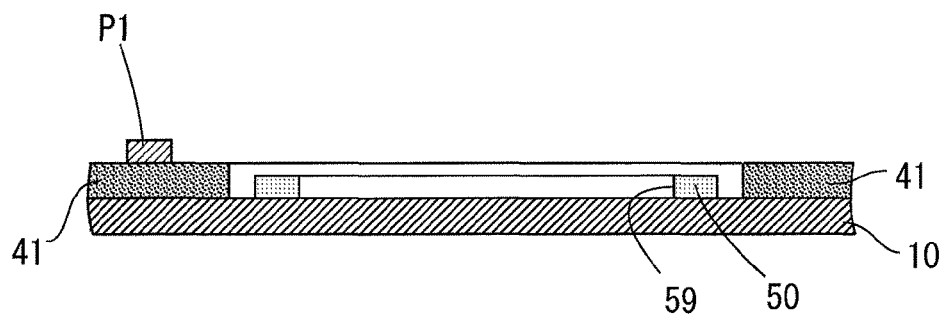
Figure 10C:
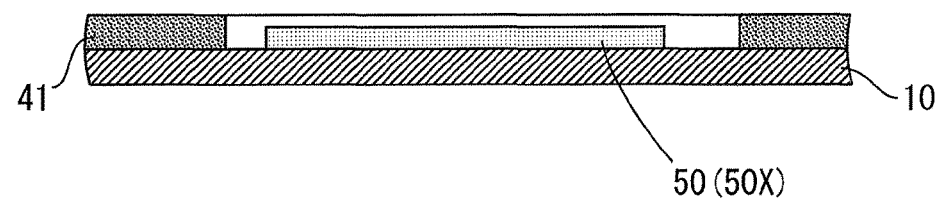

Next, as shown in FIGS. 10A to 10C, the ground layer 50 made of copper is formed on the first region of the upper surface of the support substrate 10. Further, the power wiring trace P1 made of copper is formed on a predetermined region of the upper surface of the first insulating layer 41 simultaneously with the formation of the ground layer 50. At this time, as shown in FIG. 10B, the plurality of second openings 59 of FIG. 3 are formed in the ground layer 50. The plurality of second openings 59 respectively surround the plurality of second regions in which the plurality of first openings 19 are to be formed. As shown in FIG. 10C, a portion of the ground layer 50 that constitutes part of the intersection region CN1 of FIG. 2 is the second intersection wiring portion 50X. The thickness of each of the ground layer 50 and the power wiring trace P1 is not less than 1 μm and not more than 20 μm, for example.

Figure 11A:
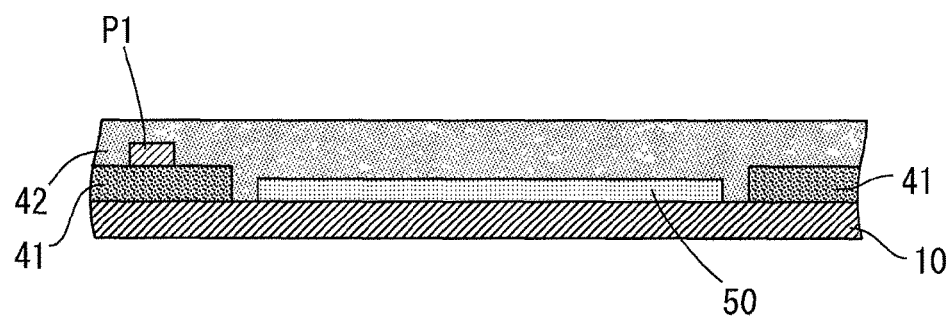
FIGS. 11A to 11C are schematic cross sectional views illustrating steps in the method of manufacturing the suspension board of FIG. 1.
Figure 11B:
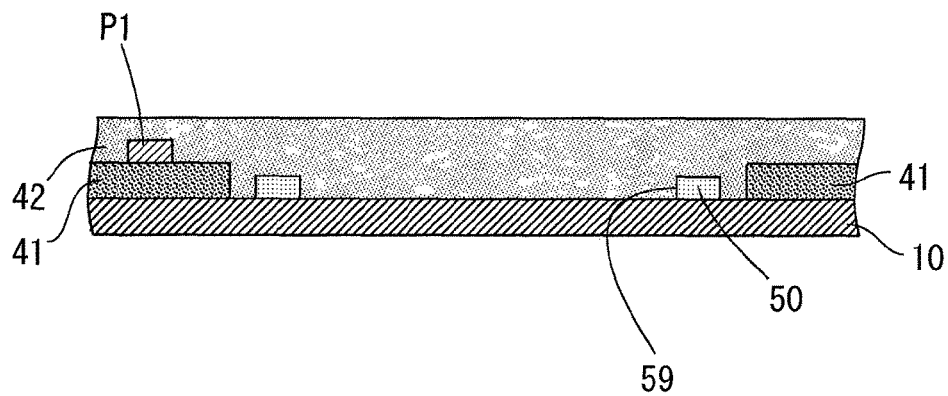
Figure 11C:
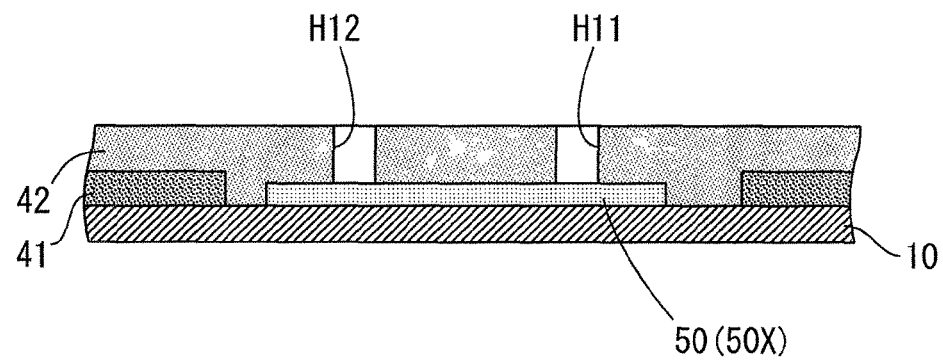

Next, as shown in FIGS. 11A to 11C, the second insulating layer 42 made of polyimide is formed on the first insulating layer 41 to cover the ground layer 50 and the power wiring trace P1. At this time, the second insulating layer 42 is formed to come into contact with the ground layer 50. As shown in FIG. 11C, the two through holes H11, H12, which are arranged to be spaced apart from each other in a portion of the second insulating layer 42 that constitutes the intersection region CN1 of FIG. 2, are to be formed. Thus, two portions of the upper surface of the second intersection wiring portion 50X are exposed to a space above the second insulating layer 42 through the two through holes H11, H12. The thickness of the second insulating layer 42 (the thickness of each of the portions, which overlaps with the first insulating layer 41 and does not overlap with the power wiring trace P1, of the second insulating layer 42 in the example of FIGS. 11A to 11C) is not less than 1 μm and not more than 25 μm, for example.

Figure 12A:
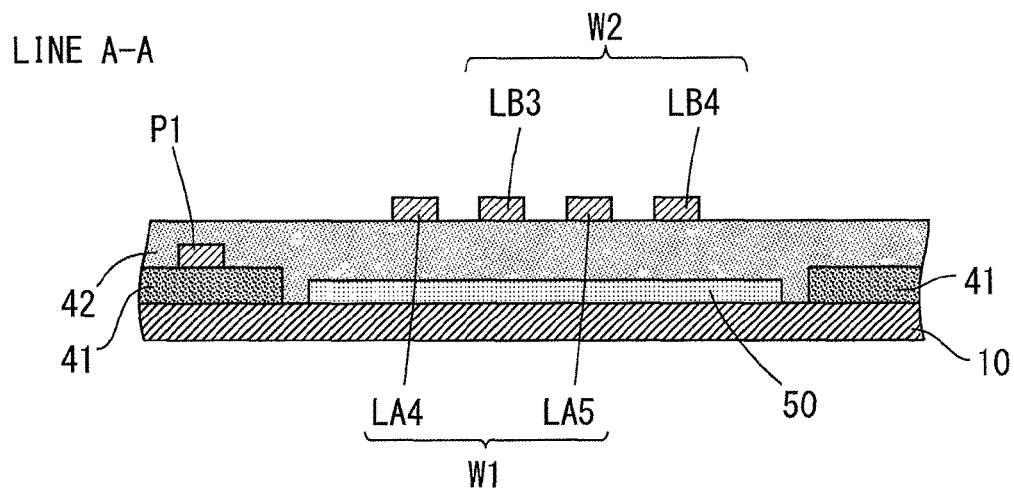
FIGS. 12A to 12C are schematic cross sectional views illustrating steps in the method of manufacturing the suspension board of FIG. 1.
Figure 12B:
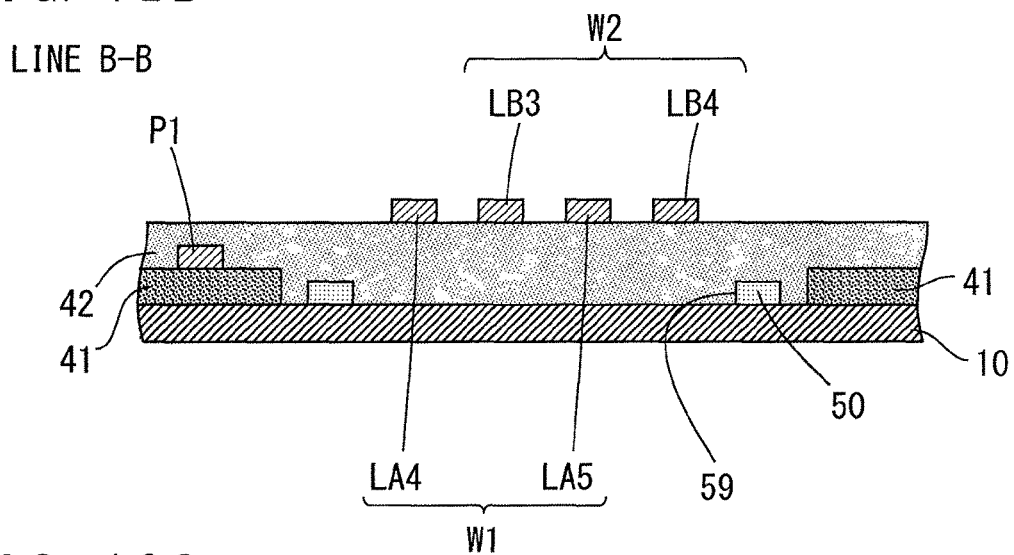
Figure 12C:
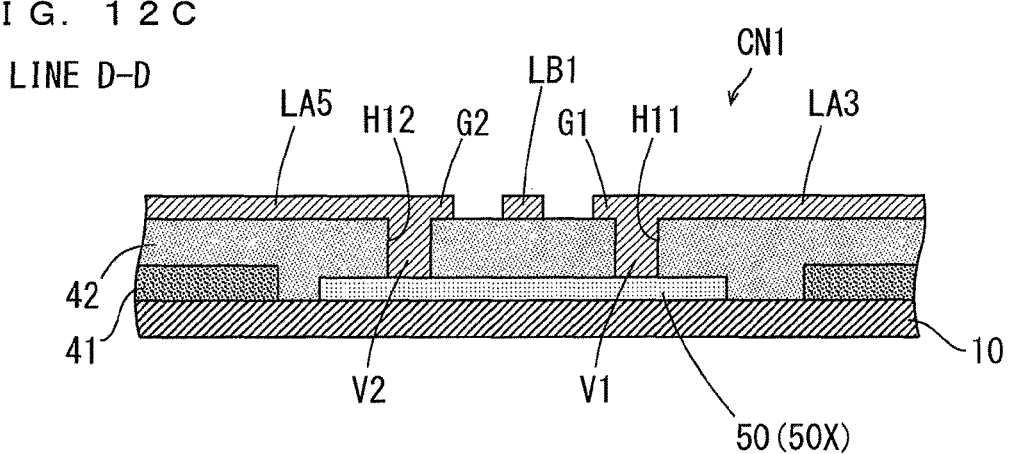

Then, as shown in FIGS. 12A to 12C, the write wiring traces W1, W2 made of copper are formed on the second insulating layer 42 to at least partially overlap with the ground layer 50. In the present example, as shown in FIG. 12A, part of each of the lines LA4, LA5, LB3, LB4 of the write wiring traces W1, W2 is positioned over the ground layer 50. Further, as shown in FIG. 12B, other part of each of the lines LA4, LA5, LB3, LB4 is positioned over the plurality of second openings 59 formed in the ground layer 50. Further, as shown in FIG. 12C, the connection portion G1 provided at the other end of the line LA3 of the write wiring trace W1 and the connection portion G2 provided at the one end of the line LA5 of the write wiring trace W1 are positioned on the second intersection wiring portion 50X. When the lines LA3, LA5 are formed, inside of each of the two through holes H11, H12 formed in the second insulating layer 42 is filled with copper. Thus, the vias V1, V2 are formed.

The thickness of each of the write wiring traces W1, W2 is not less than 1 μm and not more than 20 μm, for example. The width of each of the lines LA1 to LA5, LB1 to LB5 that constitutes each of the write wiring traces W1, W2 is not less than 6 μm and not more than 100 μm, for example. Further, a distance between each set of two adjacent lines among the lines LA4, LB3, LA5, LB4 is not less than 6 μm and not more than 100 μm, for example. An outer diameter of each of the vias V1, V2 is not less than 15 μm and not more than 150 μm, for example.

Figure 13A:
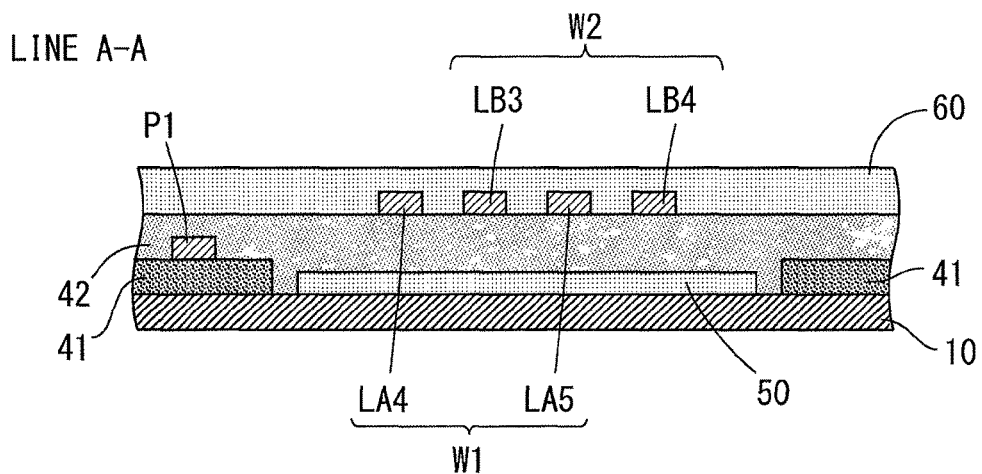
FIGS. 13A to 13C are schematic cross sectional views illustrating steps in the method of manufacturing the suspension board of FIG. 1.
Figure 13B:
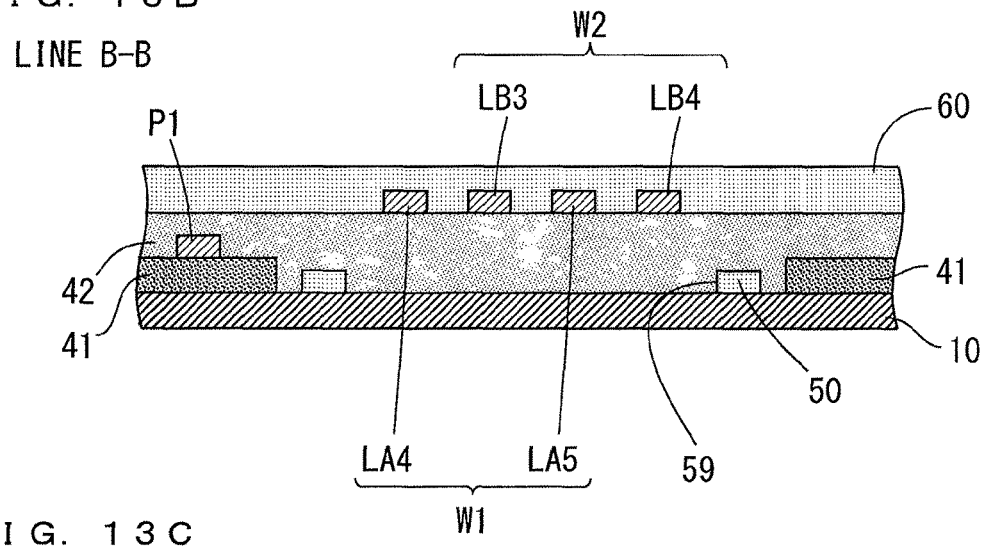
Figure 13C:
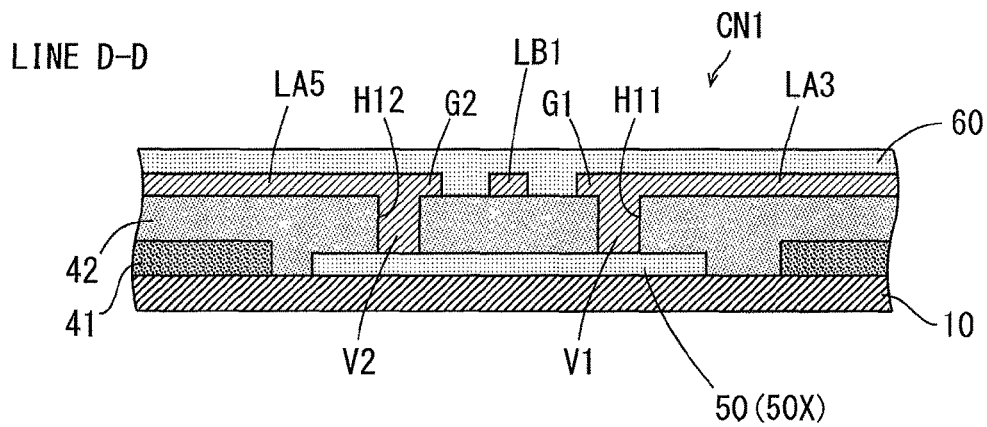

Next, as shown in FIGS. 13A to 13C, the third insulating layer 60 made of polyimide is formed on the second insulating layer 42 to cover the write wiring traces W1, W2. The third insulating layer 60 is used to protect the write wiring traces W1, W2. The thickness of the third insulating layer 60 (the thickness of each of the portions, which does not overlap with each of the write wiring traces W1, W2, of the third insulating layer 60 in the example of FIGS. 13A to 13C) is not less than 2 μm and not more than 25 μm, for example.

Figure 14A:
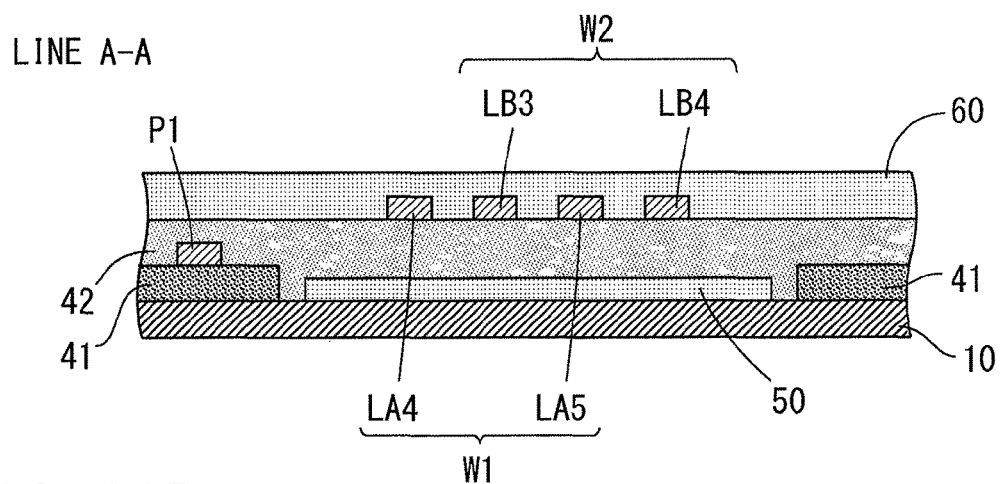
FIGS. 14A to 14C are schematic cross sectional views illustrating steps in the method of manufacturing the suspension board of FIG. 1.
Figure 14B:
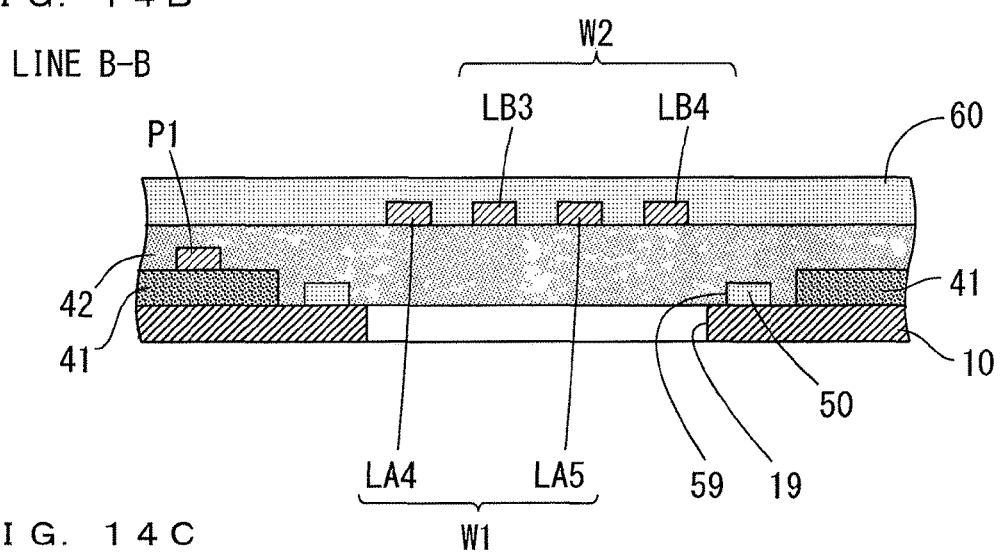
Figure 14C:
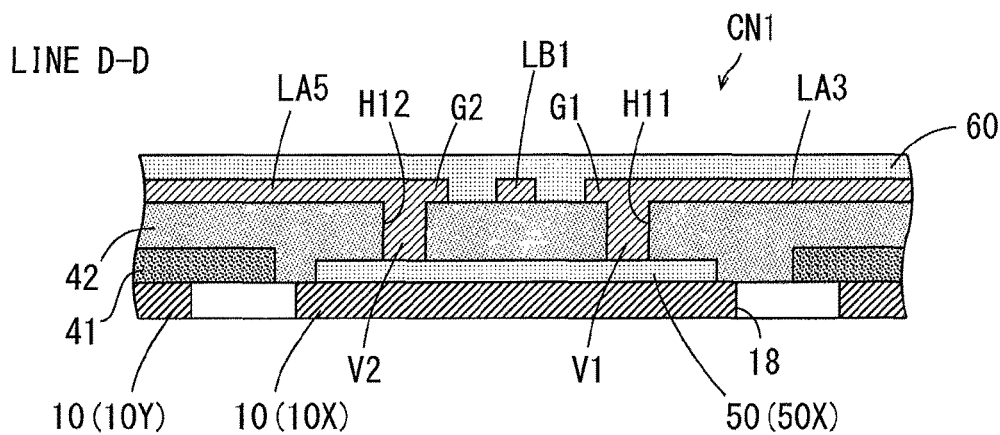

Finally, as shown in FIGS. 14A to 14C, the outer edge of the support substrate 10 is processed according to the design dimension, and the plurality of first openings 19 and the annular opening 18 are formed at positions in the plurality of second and third regions set in the upper surface of the support substrate 10. Thus, the suspension board 1 is completed.

(4) Effects

In the suspension board 1 according to the present embodiment, the ground layer 50 and the first insulating layer 41 are formed on the support substrate 10. The power wiring trace P1 is formed on the first insulating layer 41. Further, the second insulating layer 42 is formed on the support substrate 10 to cover the ground layer 50 and the first insulating layer 41. Further, each of the write wiring traces W1, W2 is formed on the second insulating layer 42 to at least partially overlap with the ground layer 50. In this case, an electric signal can be transmitted through each of the power wiring trace P1 and the write wiring traces W1, W2.

In the above-mentioned configuration, because the ground layer 50 is positioned between at least part of each of the write wiring traces W1, W2 and the support substrate 10, electromagnetic waves radiated from each of the write wiring traces W1, W2 towards the support substrate 10 at least partially enter the ground layer 50 and do not reach the support substrate 10. Further, in the above-mentioned configuration, the distance d1 between the ground layer 50 and each of the write wiring traces W1, W2 in the substrate stacking direction is set larger than the distance d2 between the power wiring trace P1 and the write wiring trace W1 in the substrate stacking direction. In this case, an eddy current generated in the ground layer 50 is reduced as compared to the case where the ground layer 50 is formed on the first insulating layer 41. This results in the reduced loss of the electric signal transmitted through each of the write wiring traces W1, W2 in a high frequency band.

In the above-mentioned example, the support substrate 10 made of stainless steel is used. In this case, sufficient rigidity required to support the write wiring traces W1, W2, the read wiring traces R1, R2 and the power wiring traces P1, P2 can be ensured by the stainless steel in the support substrate 10. Further, a passive film is formed on the surface of the stainless steel, thus inhibiting deterioration of the support substrate 10 caused by corrosion.

[2] Second Embodiment

Figure 15:
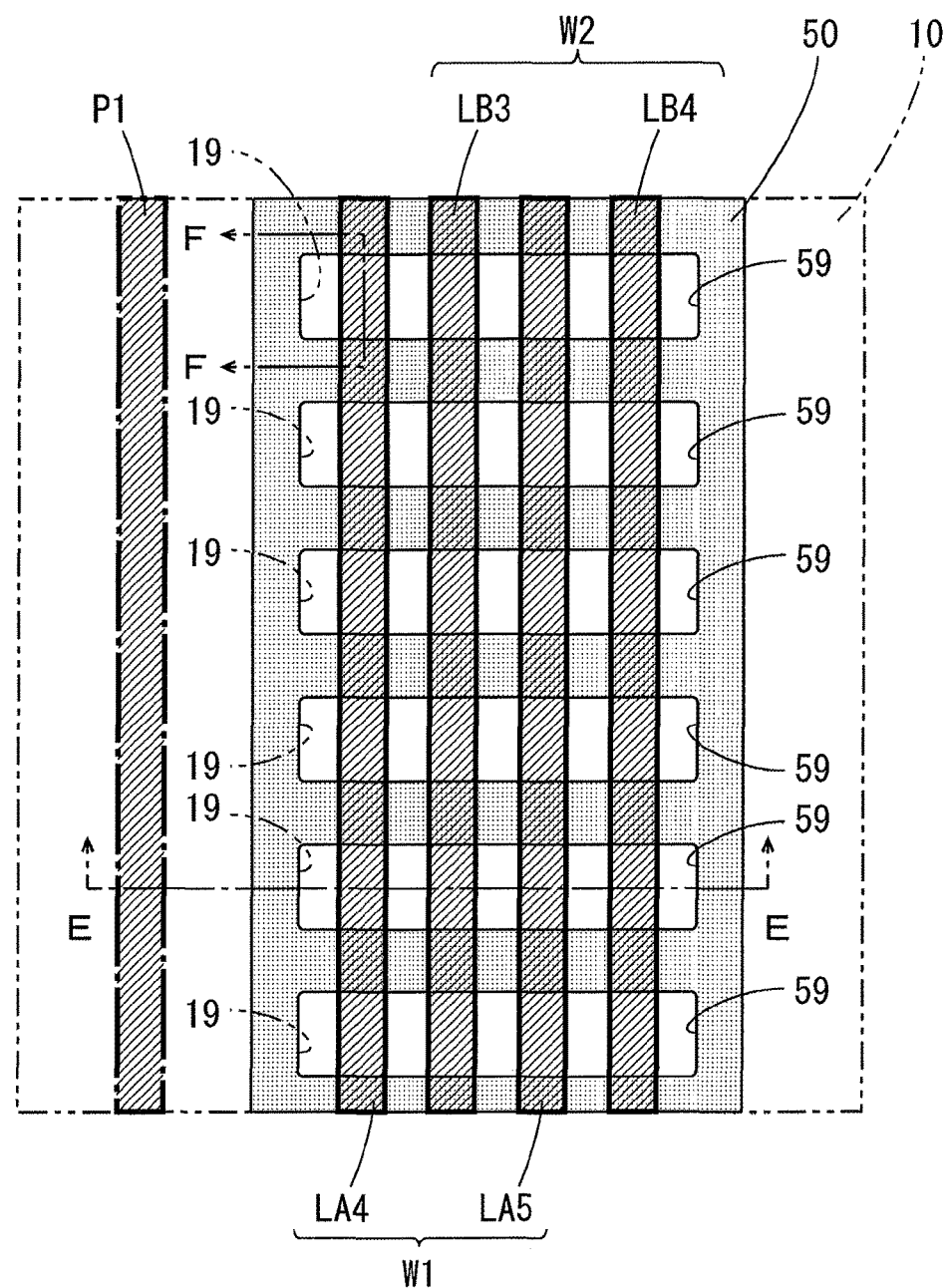
FIG. 15 is a partially enlarged plan view of a suspension board according to a second embodiment.
Figure 16:
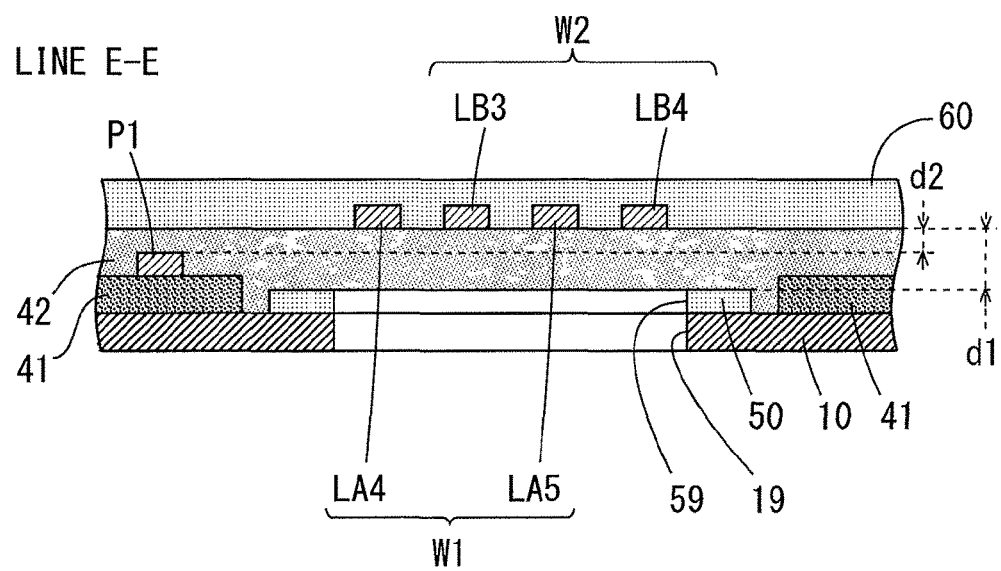
FIG. 16 is a cross sectional view taken along the line E-E of FIG. 15.
Figure 17:
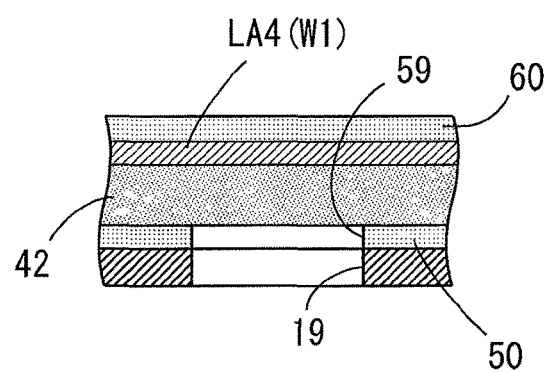
FIG. 17 is a cross sectional view taken along the line F-F of FIG. 15.

As for a suspension board according to the second embodiment, differences from the suspension board 1 according to the first embodiment will be described. FIG. 15 is a partially enlarged plan view of the suspension board according to the second embodiment, FIG. 16 is a cross sectional view taken along the line E-E of FIG. 15, and FIG. 17 is a cross sectional view taken along the line F-F of FIG. 15. The partially enlarged plan view of FIG. 15 corresponds to the enlarged plan view of FIG. 3. In FIG. 15, similarly to FIG. 3, part of the constituent elements among the plurality of constituent elements of the suspension board is indicated by different display patterns, and other constituent elements are not shown.

As shown in FIGS. 15 to 17, in the case where the suspension board according to the present embodiment is viewed in the substrate stacking direction, an inner edge of each second opening 59 in a ground layer 50 and an inner edge of each first opening 19 in a support substrate 10 overlap with each other. In this configuration, a material having excellent corrosion resistance such as gold is used for the ground layer 50, thus preventing the corrosion of the ground layer 50 from the inner edge of each second opening 59.

In the method of manufacturing of the first embodiment shown in FIGS. 9A to 14C, the plurality of second openings 59 are formed when the ground layer 50 is formed on the support substrate 10 (see FIG. 10B). In contrast, in a method of manufacturing the suspension board according to the present embodiment, the plurality of second openings 59 are not formed in a step of forming the ground layer 50 on the support substrate 10. In the step of forming the plurality of first openings 19 in the support substrate 10 (see FIG. 14B), the plurality of first openings 19 are formed and the plurality of second openings 59 are formed in the ground layer 50.

Also in the suspension board according to the present embodiment, each of write wiring traces W1, W2 partially overlaps with the ground layer 50 as shown in FIG. 15. Further, as shown in FIG. 16, a distance d1 between the ground layer 50 and the write wiring trace W1 in the substrate stacking direction is set larger than a distance d2 between a power wiring trace P1 and the write wiring trace W1 in the substrate stacking direction. This reduces a loss of an electric signal transmitted through each of the write wiring traces W1, W2 in a high frequency band.

[3] Third Embodiment

Figure 18:
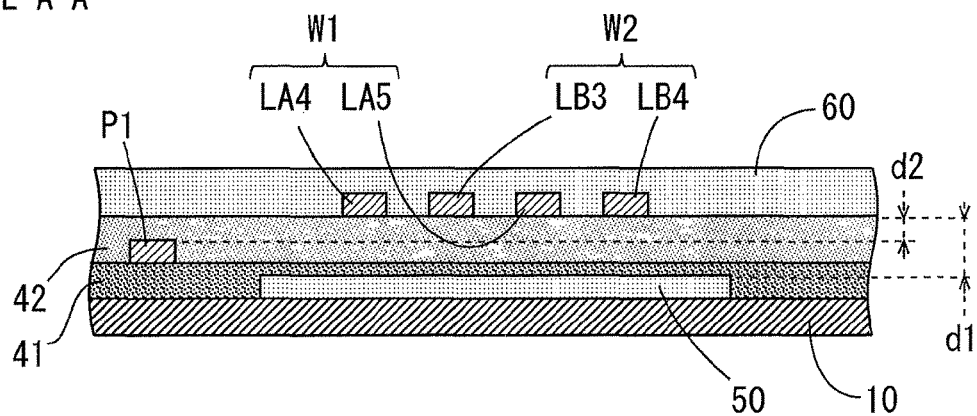
FIG. 18 is a cross sectional view of a portion, of the suspension board according to the third embodiment, corresponding to a portion taken along the line A-A of FIG. 3.
Figure 19:
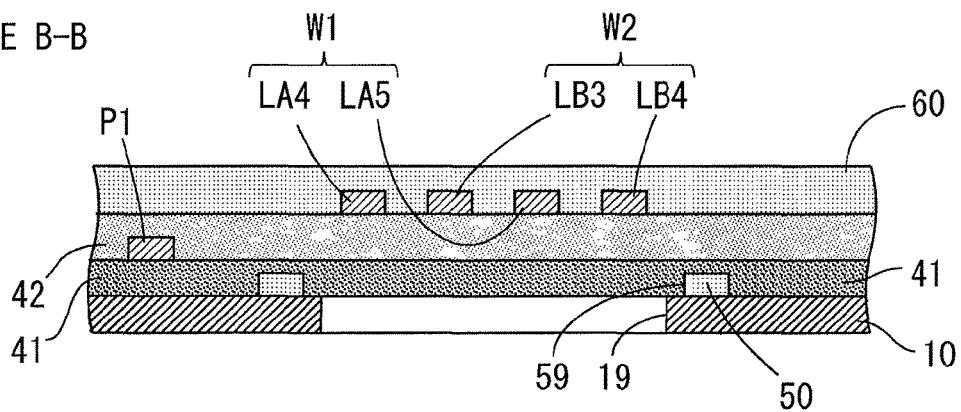
FIG. 19 is a cross sectional view of a portion, of the suspension board according to the third embodiment, corresponding to a portion taken along the line B-B of FIG. 3.
Figure 20:
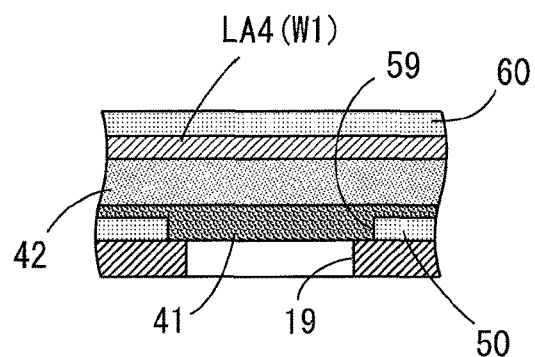
FIG. 20 is a cross sectional view of a portion, of the suspension board according to the third embodiment, corresponding to a portion taken along the line C-C of FIG. 3.

As for a suspension board according to the third embodiment, differences from the suspension board 1 according to the first embodiment will be described. FIG. 18 is a cross sectional view of a portion, of the suspension board according to the third embodiment, corresponding to the portion taken along the line A-A of FIG. 3. FIG. 19 is a cross sectional view of a portion, of the suspension board according to the third embodiment, corresponding to the portion taken along the line B-B of FIG. 3. FIG. 20 is a cross sectional view of a portion, of the suspension board according to the third embodiment, corresponding to the portion taken along the line C-C of FIG. 3.

As shown in FIGS. 18 to 20, in the suspension board of the present example, a first insulating layer 41 has a portion that extends between a ground layer 50 and a second insulating layer 42. Further, the extending portion of the first insulating layer 41 is formed to come into contact with the ground layer 50.

FIGS. 21A to 27C are schematic cross sectional views illustrating steps in a method of manufacturing the suspension board according to the third embodiment. In diagrams of FIGS. 21A to 27C, each of FIGS. 21A, 22A, 23A, 24A, 25A, 26A and 27A shows a cross sectional view of a portion, of the suspension board according to the present embodiment, corresponding to the portion taken along the line A-A of FIG. 3. Further, each of FIGS. 21B, 22B, 23B, 24B, 25B, 26B and 27B shows a cross sectional view of a portion, of the suspension board according to the present embodiment, corresponding to the portion taken along the line B-B of FIG. 3, and each of FIGS. 21C, 22C, 23C, 24C, 25C, 26C and 27C shows a portion, of the suspension board according to the present embodiment, corresponding to the portion taken along the line D-D of FIG. 7.

First, an elongated substrate made of stainless steel is prepared as a support substrate 10. Also in the present embodiment, in an upper surface of the support substrate 10, a first region in which the ground layer 50 of FIG. 3 is to be formed, a plurality of second regions in which a plurality of first openings 19 of FIG. 3 are to be formed, and a third region in which an annular opening 18 of FIG. 7 is to be formed are determined in advance similarly to the first embodiment.

Figure 21A:
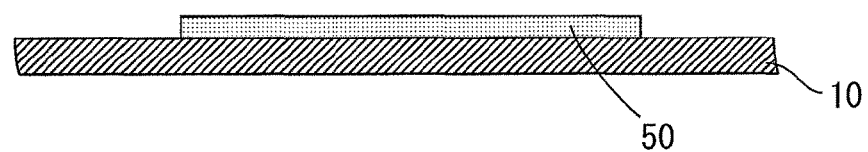
FIGS. 21A to 21C are schematic cross sectional views illustrating steps in a method of manufacturing the suspension board according to the third embodiment.
Figure 21B:
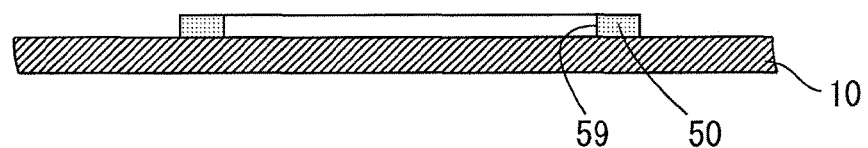
Figure 21C:
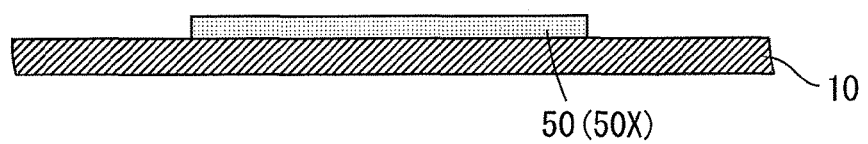

Subsequently, as shown in FIG. 21A to 21C, the ground layer 50 made of copper is formed on the first region of the upper surface of the prepared support substrate 10. At this time, as shown in FIG. 21B, a plurality of second openings 59 are formed in the ground layer 50. The plurality of second openings 59 surround the plurality of second regions in which the plurality of first openings 19 are to be formed, respectively. As shown in FIG. 21C, a portion of the ground layer 50 that constitutes the intersection region CN1 of FIG. 2 is the second intersection wiring portion 50X.

Figure 22A:
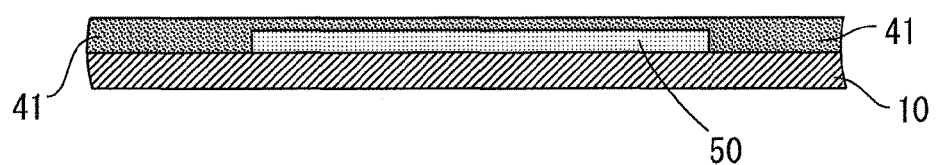
FIGS. 22A to 22C are schematic cross sectional views illustrating steps in the method of manufacturing the suspension board according to the third embodiment.
Figure 22B:
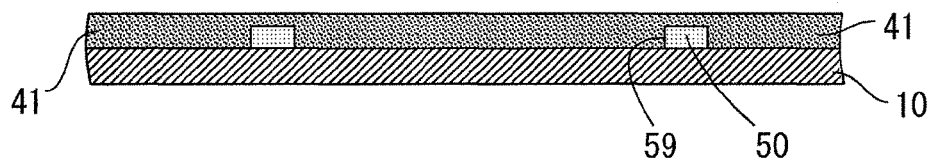
Figure 22C:
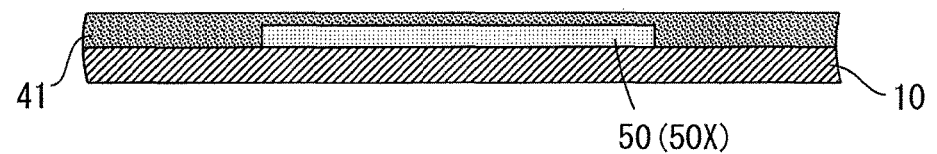
Figure 23A:
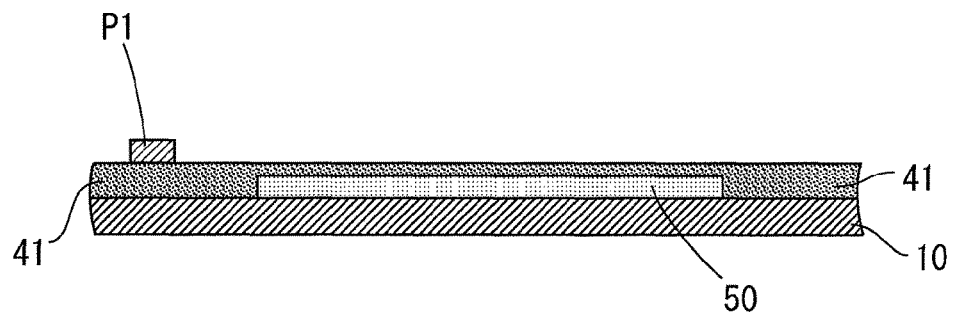
FIGS. 23A to 23C are schematic cross sectional views illustrating steps in the method of manufacturing the suspension board according to the third embodiment.
Figure 23B:
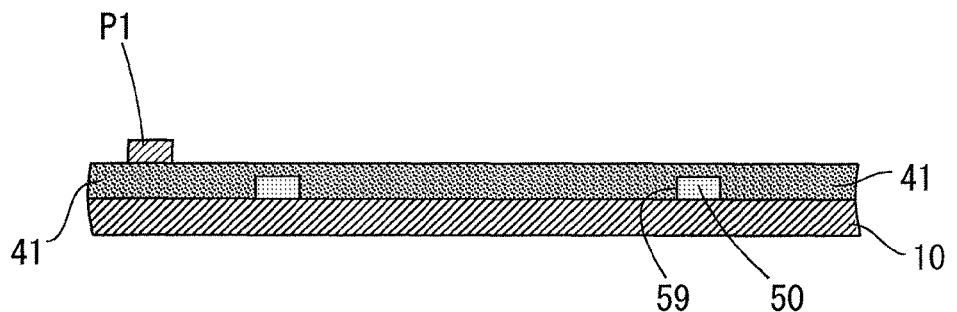
Figure 23C:
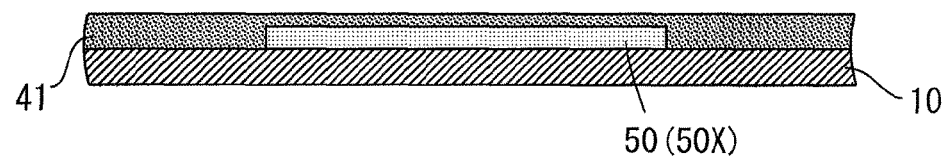

Next, as shown in FIGS. 22A to 22C, the first insulating layer 41 made of polyimide is formed on the entire upper surface of the support substrate 10 to cover the ground layer 50 and come into contact with the ground layer 50. Thereafter, as shown in FIGS. 23A to 23C, a power wiring trace P1 made of copper is formed on a predetermined region of the upper surface of the first insulating layer 41.

Figure 24A:
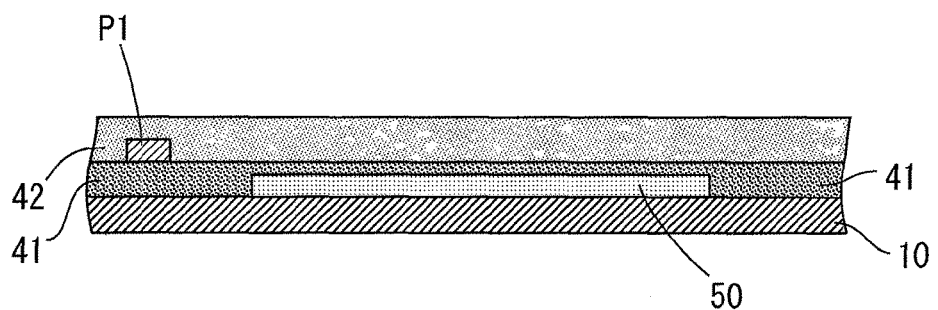
FIGS. 24A to 24C are schematic cross sectional views illustrating steps in the method of manufacturing the suspension board according to the third embodiment.
Figure 24B:
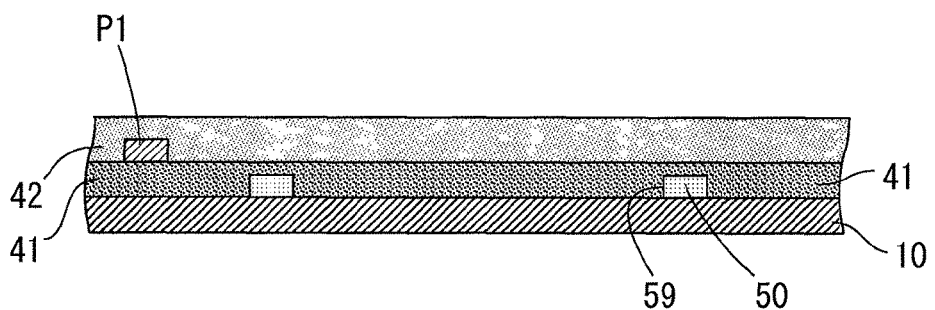
Figure 24C:
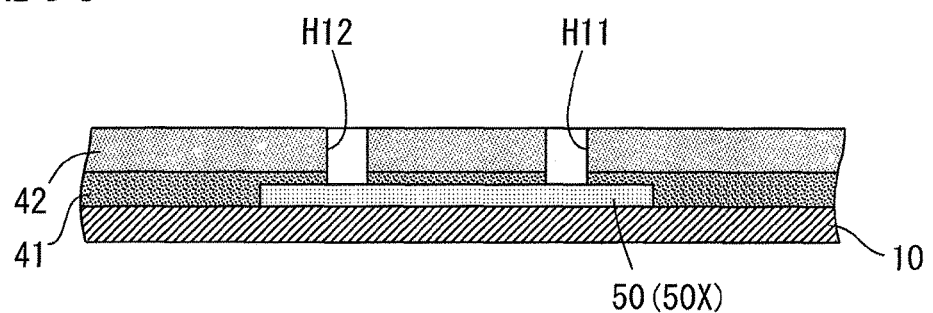

Next, as shown in FIGS. 24A to 24C, a second insulating layer 42 made of polyimide is formed on the entire upper surface of the first insulating layer 41 to cover the power wiring trace P1. Thus, a portion of the first insulating layer 41 extending between the ground layer 50 and the second insulating layer 42 is formed. As shown in FIG. 24C, two through holes H11, H12 arranged to be spaced apart from each other are formed in portions of the second insulating layer 42 that constitute the intersection region CN1 of FIG. 2.

Figure 25A:
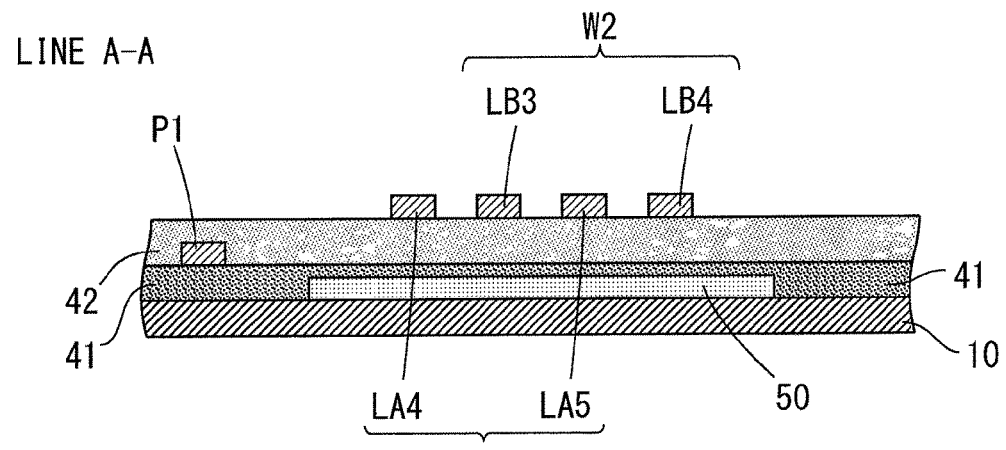
FIGS. 25A to 25C are schematic cross sectional views illustrating steps in the method of manufacturing the suspension board according to the third embodiment.
Figure 25B:
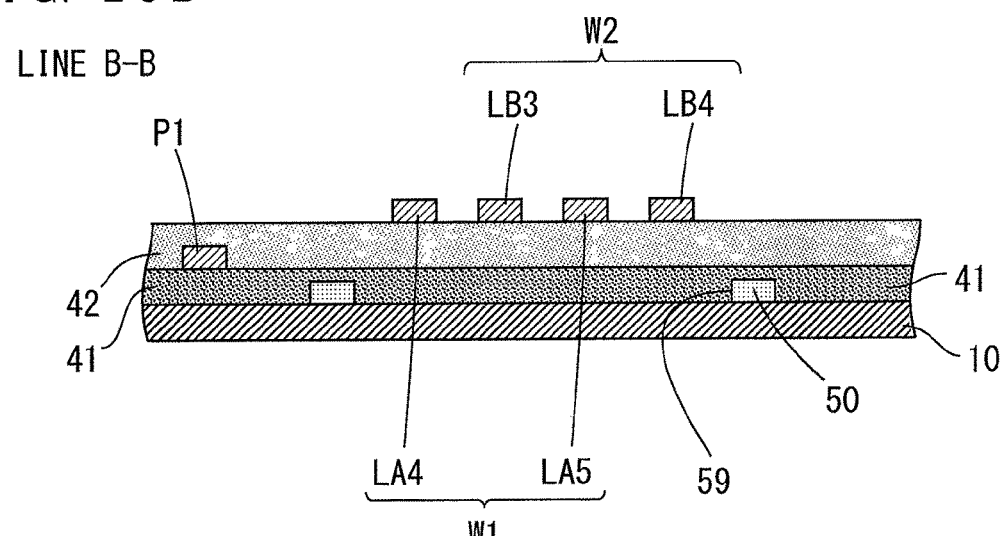
Figure 25C:
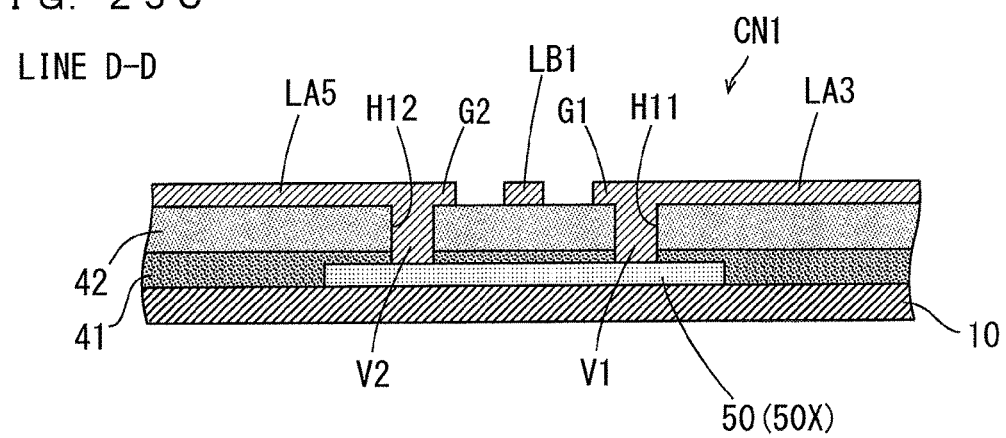

Then, as shown in FIGS. 25A to 25C, write wiring traces W1, W2 made of copper are formed on the second insulating layer 42 to at least partially overlap with the ground layer 50. When lines LA3, LA5 of the write wiring trace W1 are formed, vias V1, V2 are formed inside of the two through holes H11, H12 formed in the second insulating layer 42.

Figure 26A:
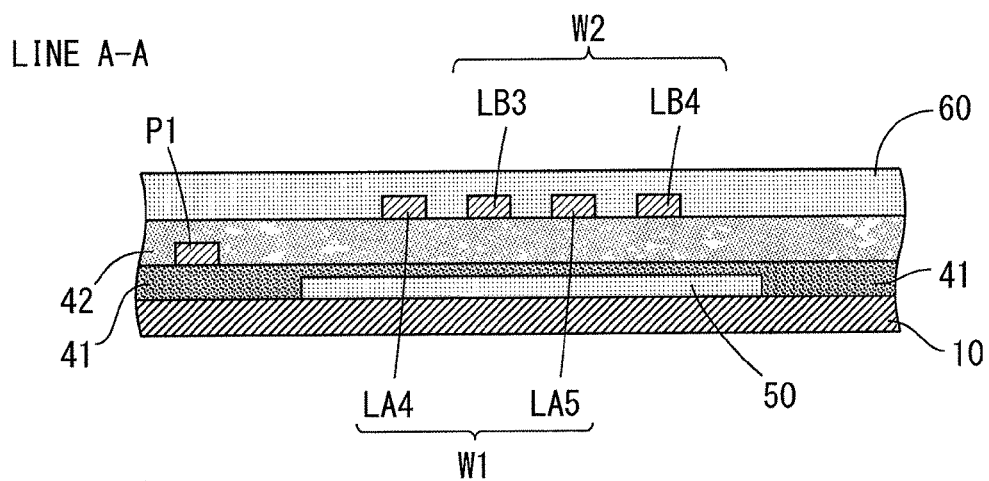
FIGS. 26A to 26C are schematic cross sectional views illustrating steps in the method of manufacturing the suspension board according to the third embodiment.
Figure 26B:
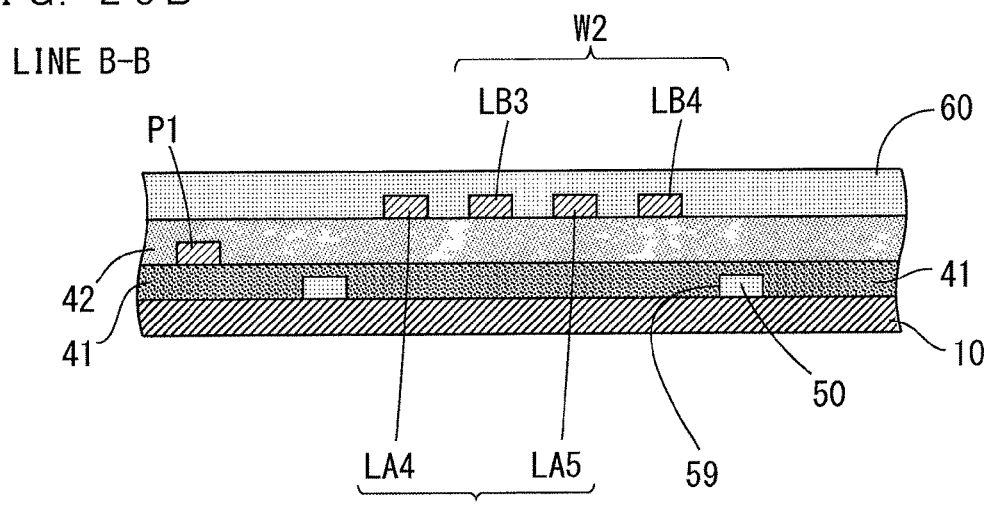
Figure 26C:
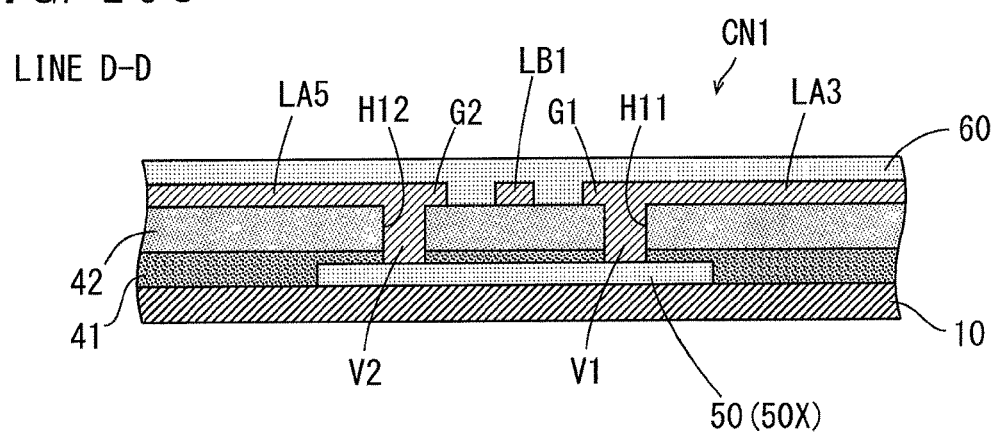

Next, as shown in FIGS. 26A to 26C, a third insulating layer 60 made of polyimide is formed on the second insulating layer 42 to cover the write wiring traces W1, W2.

Figure 27A:
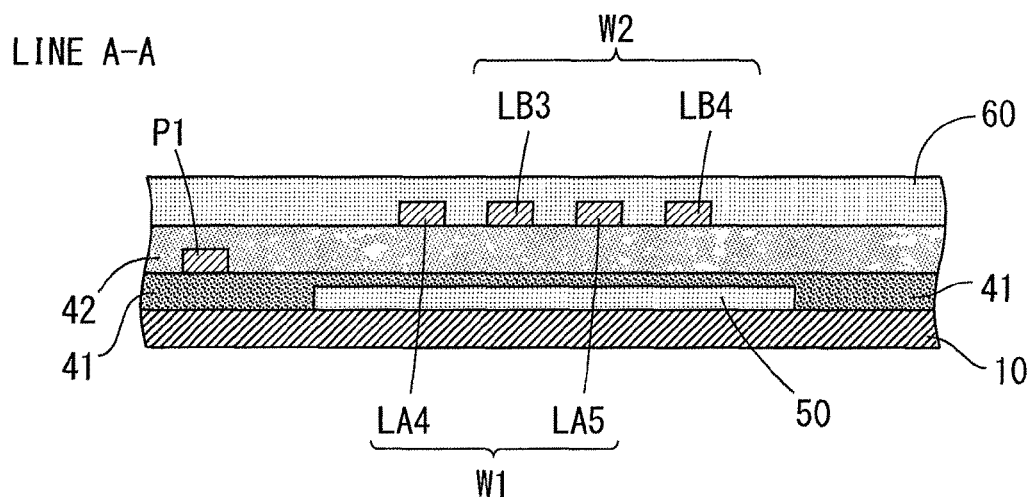
FIGS. 27A to 27C are schematic cross sectional views illustrating steps in the method of manufacturing the suspension board according to the third embodiment.
Figure 27B:
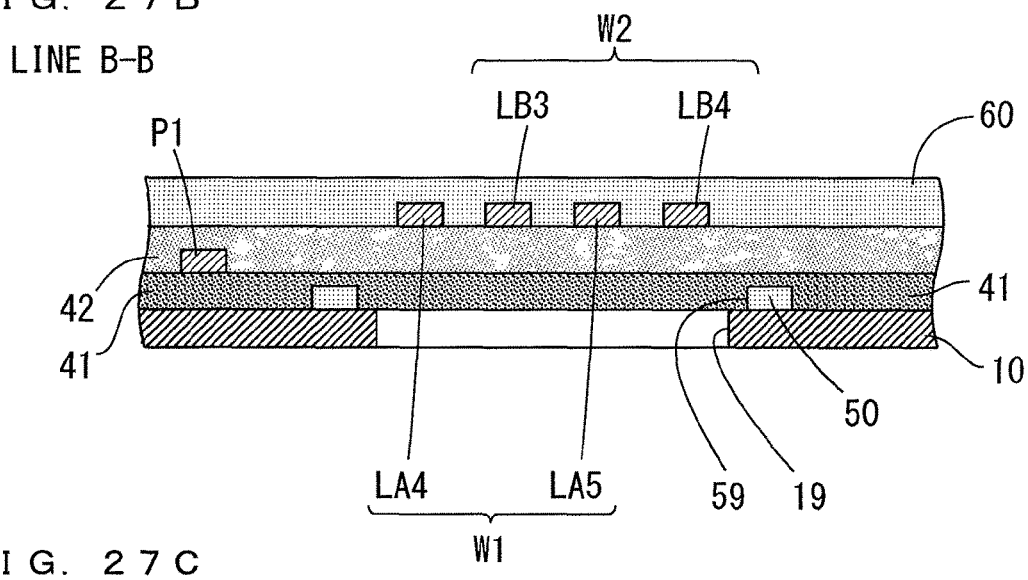
Figure 27C:
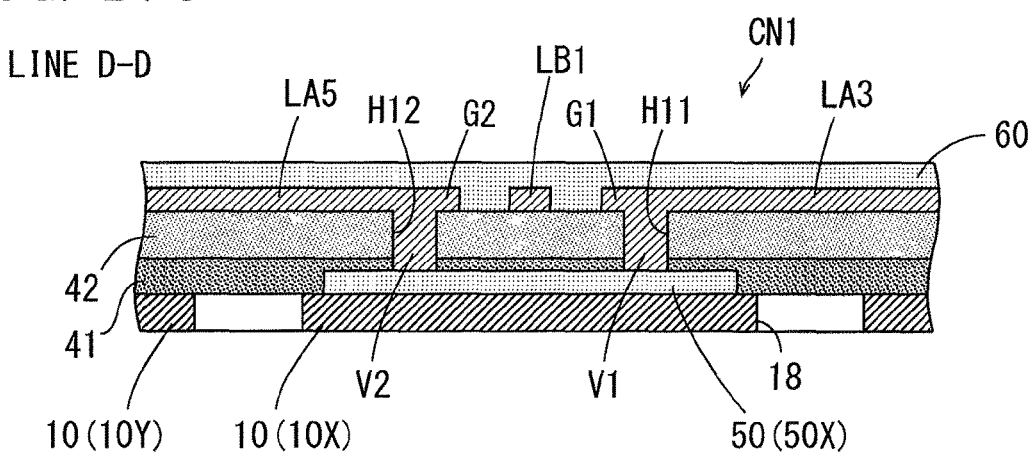

Finally, as shown in FIGS. 27A to 27C, an outer edge of the support substrate 10 is processed according to the design dimension, and the plurality of first openings 19 and an annular opening 18 are formed at positions in the plurality of second and third regions set in the upper surface of the support substrate 10. Thus, the suspension board 1 is completed.

Also in the suspension board according to the present invention, as shown in FIG. 18, each of the write wiring traces W1, W2 partially overlaps with the ground layer 50. Further, in the substrate stacking direction, a distance d1 between the ground layer 50 and the write wiring trace W1 is set larger than a distance d2 between the power wiring trace P1 and the write wiring trace W1. This reduces a loss of an electric signal transmitted through each of the write wiring traces W1, W2 in a high frequency band.

In the present embodiment, the ground layer 50 is formed on the support substrate 10, and then the first insulating layer 41 can be formed on the entire upper surface of the support substrate 10 to cover the ground layer 50. Therefore, when the first insulating layer 41 is formed on the support substrate 10, it is not necessary to perform patterning on the first insulting layer 41.

[4] Other Embodiments (1) In the above-mentioned embodiment, part of the support substrate 10 is formed as the first intersection wiring portion 10X in each of the intersection regions CN1, CN2, and the second intersection wiring portion 50X is formed on the first intersection wiring portion 10X. However, the present invention is not limited to this.

Figure 28:
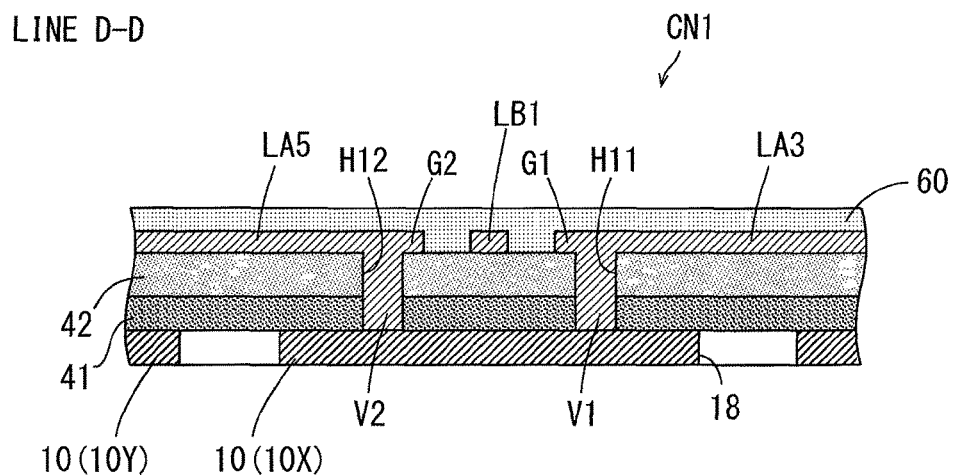
FIG. 28 is a cross sectional view showing another example of the configuration of the intersection region.

The second intersection wiring portion 50X does not have to be formed on a first intersection wiring portion 10X. FIG. 28 is a cross sectional view showing another example of a configuration of an intersection region CN1. The cross sectional view of FIG. 28 corresponds to the cross sectional view taken along the line D-D of FIG. 7. In the example of FIG. 28, the second intersection wiring portion 50X is not formed on the first intersection wiring portion 10X. Thus, lines LA3, LA5 are electrically connected to each other through vias V1, V2 and the first intersection wiring portion 10X. In this case, the structure of each of the intersection regions CN1, CN2 is simplified.

Figure 29:
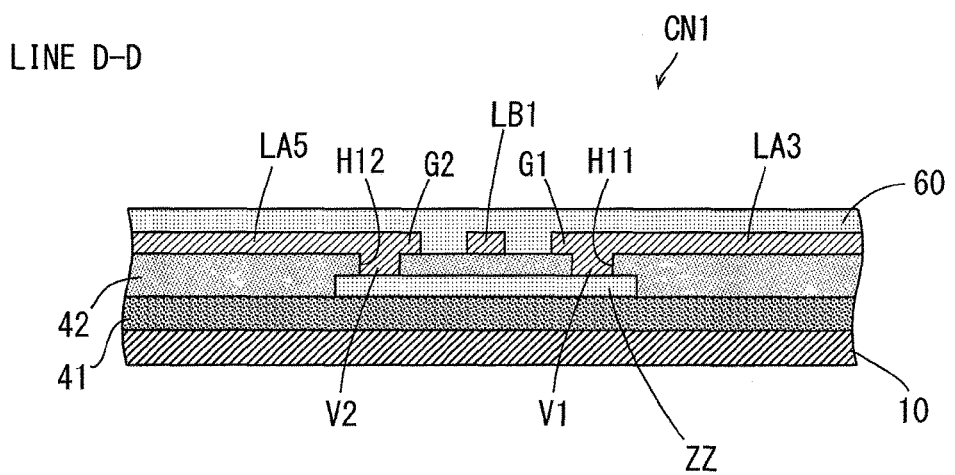
FIG. 29 is a cross sectional view showing yet another example of the configuration of the intersection region.

Alternatively, in each of the intersection regions CN1, CN2, the first intersection wiring portion 10X does not have to be formed on a support substrate 10, and an intersection wiring portion may be formed on an upper surface of a first insulating layer 41. FIG. 29 is a cross sectional view showing yet another example of the configuration of the intersection region CN1. The cross sectional view of FIG. 29 corresponds to the cross sectional view taken along the line D-D of FIG. 7. In the example of FIG. 29, an intersection wiring portion ZZ is formed on the upper surface of the first insulating layer 41 instead of the first intersection wiring portion 10X of FIG. 8 formed in the support substrate 10. The intersection wiring portion ZZ is formed on the first insulating layer 41 and made of the same material as power wiring traces P1, P2 in a step of forming the power wiring traces P1, P2, for example. Such a configuration allows the lines LA3, LA5 to be electrically connected to each other through vias V1, V2 and the intersection wiring portion ZZ. In this case, it is not necessary to form an annular opening 18 in a portion of the support substrate 10 in each of the intersection regions CN1, CN2. This enables high rigidity of portions of the support substrate 10 positioned in the intersection regions CN1, CN2 and their vicinity to be maintained.

(2) While each of the power wiring traces P1, P2 is a low frequency line for allowing an electric signal having a low frequency band to be transmitted therethrough in the above-mentioned embodiment, the present invention is not limited to this. In the case where a loss of an electric signal transmitted through each of power wiring traces P1, P2 is allowed to a certain degree, an electric signal having a high frequency band may be transmitted through each of the power wiring traces P1, P2. That is, the power wiring traces P1, P2 may be used as high frequency lines.

[5] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the present embodiment described above, the support substrate 10 is an example of a support substrate, the ground layer 50 is an example of a ground layer, the first insulating layer 41 is an example of a first insulating layer, the power wiring trace P1 is an example of a lower wiring trace, the second insulating layer 42 is an example of a second insulating layer, and the write wiring traces W1, W2 are examples of an upper wiring trace.

Further, the distance d1 is an example of a distance between the ground layer and the upper wiring trace, and the distance d2 is an example of a distance between the lower wiring trace and the upper wiring trace, and the suspension board 1 is an example of a printed circuit board.

Further, the first opening 19 is an example of a first opening, the second opening 59 is an example of a second opening, the via V1 is an example of a first via, the via V2 is an example of a second via, the support portion 10Y is an example of a support portion, the first intersection wiring portion 10X is an example of a wiring portion, the write wiring trace W1 is an example of a first signal line and the write wiring trace W2 is an example of a second signal line.

Further, the lines LA3, LA5 are examples of a first branch line, the line LA4 is an example of a second branch line, the line LB3 is an example of a third branch line, the line LB4 is an example of a fourth branch line, the line LA3 is an example of part of the first branch line, and the line LA5 is an example of a remaining portion of the first branch line, the intersection wiring portion ZZ is an example of a relay trace, and the third insulating layer 60 is an example of a third insulating layer.

As each of constituent elements recited in the claims, various other elements having configurations or functions described in the claims can be also used.

[6] Inventive Examples and Comparative Examples

Figure 30A:
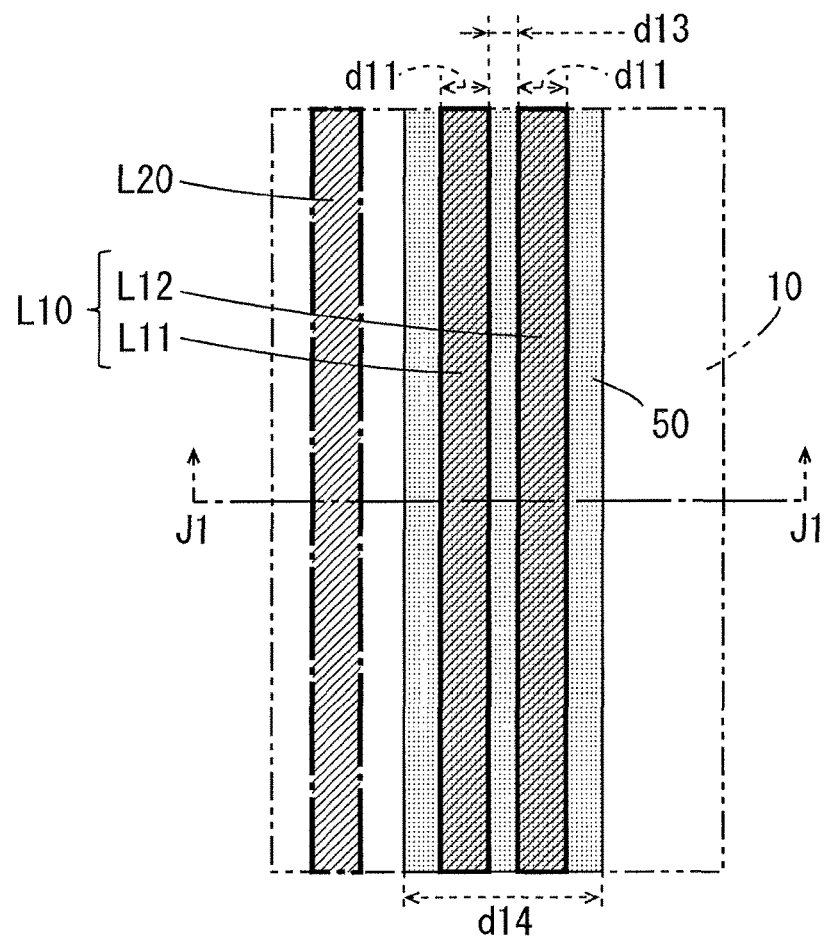
FIG. 30A is a plan view of a suspension board of an inventive example 1.

Suppose that the following suspension boards are used for the inventive examples 1, 2 and the comparative examples 1, 2. FIG. 30A is a plan view of a suspension board of the inventive example 1, and FIG. 30B is a cross sectional view taken along the line J1-J1 of FIG. 30A.

As shown in FIG. 30A, in the suspension board of the inventive example 1, an upper wiring trace L10 and a lower wiring trace L20 extending in one direction are formed to be arranged in another direction orthogonal to the one direction. The upper wiring trace L10 includes two lines L11, L12. A differential signal line pair is constituted by the lines L11, L12.

Figure 30B:
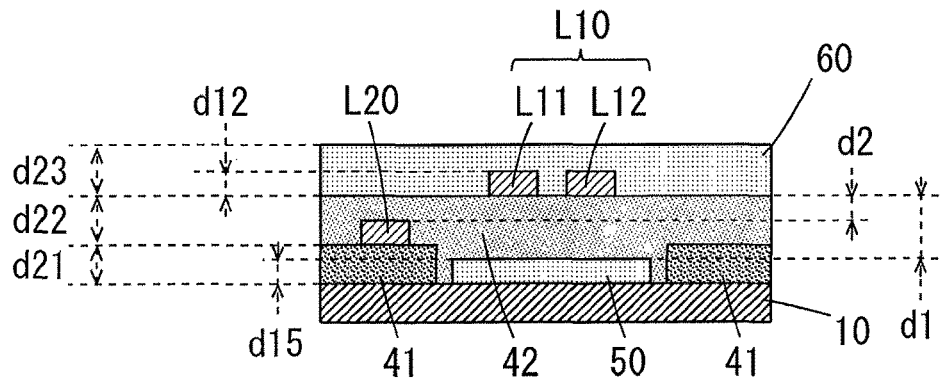
FIG. 30B is a cross sectional view taken along the line J1-J1 of FIG. 30A.

As shown in FIG. 30B, a ground layer 50 made of copper is formed on a support substrate 10 made of stainless steel. A first insulating layer 41 made of polyimide is formed in a region on the support substrate 10 in which the ground layer 50 is not formed. The lower wiring trace L20 made of copper is formed on the first insulating layer 41. A second insulating layer 42 made of polyimide is formed on the first insulating layer 41 to cover the ground layer 50 and the lower wiring trace L20. The upper wiring trace L10 made of copper is formed on the second insulating layer 42. A third insulating layer 60 made of polyimide is formed on the second insulating layer 42 to cover the upper wiring trace L10.

In FIG. 30A, the first insulating layer 41, the second insulating layer 42 and the third insulating layer 60 of FIG. 30B are not shown. Further, in FIG. 30A, the upper wiring trace L10 is indicated by thick solid lines and hatching, the lower wiring trace L20 is indicated by a thick one-dot and dash line and hatching, and the ground layer 50 is indicated by a solid line and a dotted pattern. Further, the support substrate 10 is indicated by a two-dots and dash line.

In the suspension board of the inventive example 1, the length of each of the lines L11, L12 and the lower wiring trace L20 is 20 mm. Further, a width d11 and a thickness d12 of each of the lines L11, L12 and the lower wiring trace L20 are 80 μm and 4 μm, respectively. A distance d13 between the lines L11, L12 is 20 μm. Further, a width d14 and a thickness d15 of the ground layer 50 are 300 μm and 4 μm, respectively. Further, a thickness d21 of the first insulating layer 41, a thickness d22 of the second insulating layer 42 and a thickness d23 of the third insulating layer 60 are 8 μm, 8 μm, and 12 μm, respectively. In the substrate stacking direction, a distance d1 between the ground layer 50 and each of the lines L11, L12 is 12 μm, and a distance d2 between the lower wiring trace L20 and each of the lines L11, L12 is 4 μm.

In the suspension board of the inventive example 1, an aperture ratio, described below, is set to 0%.

Figure 31A:
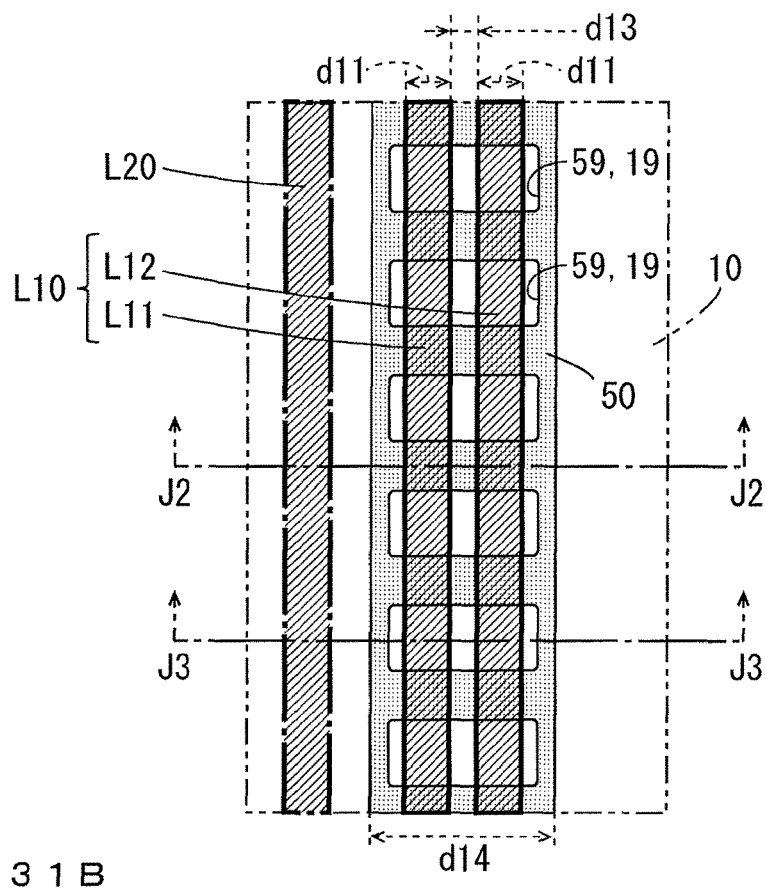
FIG. 31A is a plan view of a suspension board of an inventive example 2.
Figure 31B:
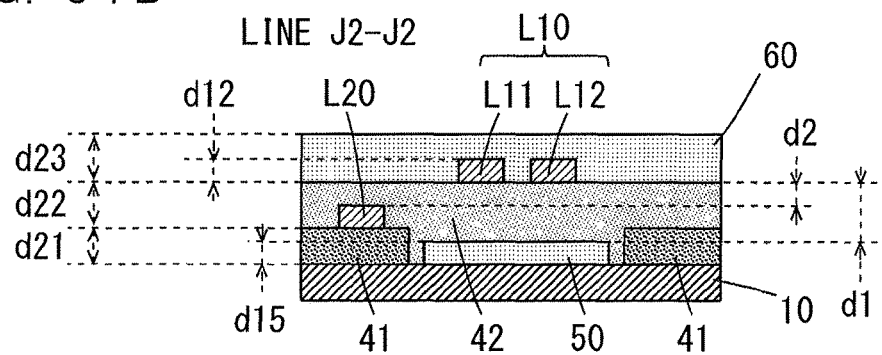
FIG. 31B is a cross sectional view taken along the line J2-J2 of FIG. 31A.
Figure 31C:
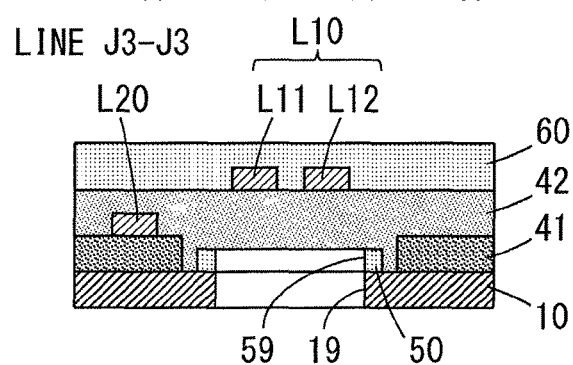
FIG. 31C is a cross sectional view taken along the line J3-J3 of FIG. 31A.

FIG. 31A is a plan view of a suspension board of the inventive example 2, FIG. 31B is a cross sectional view taken along the line J2-J2 of FIG. 31A, and FIG. 31C is a cross sectional view taken along the line J3-J3 of FIG. 31A. In FIG. 31A, similarly to the example of FIG. 30A, part of constituent elements among a plurality of constituent elements of the suspension board is indicated by different display patterns, and other constituent elements are not shown. The suspension board of the inventive example 2 have the same configuration as that of the suspension board of the inventive example 1 except for the following points.

As shown in FIGS. 31A to 31C, in the suspension board of the inventive example 2, a plurality of first openings 19 are intermittently formed to be arranged in one direction in portions of a support substrate 10 overlapping with an upper wiring trace L10. Further, a plurality of second openings 59 that respectively overlap with the plurality of first openings 19 are formed in the ground layer 50.

Suppose that a total area of portions in which the plurality of first openings 19 overlap with the upper wiring trace L10 is an aperture area. A ratio of the aperture area to an area of portions in which the upper wiring trace L10 is formed on the second insulating layer 42 (an area in which the second insulating layer 42 are in contact with the upper wiring trace L10) is referred to as the aperture ratio. In the suspension board of the inventive example 2, the aperture ratio is set to 50%.

Figure 32A:
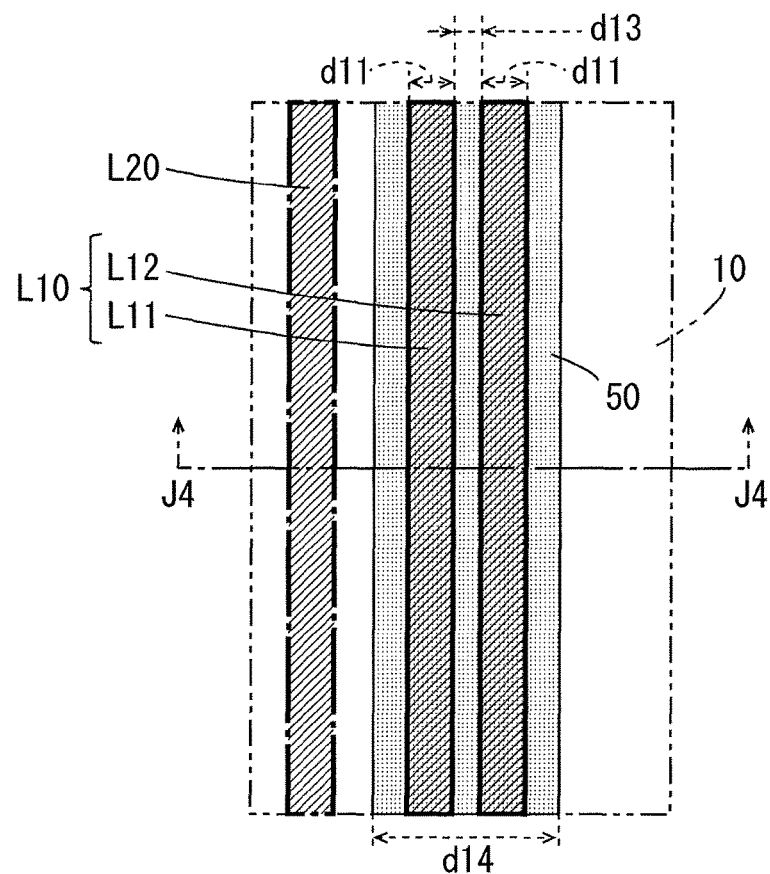
FIG. 32A is a plan view of a suspension board of a comparative example 1.
Figure 32B:
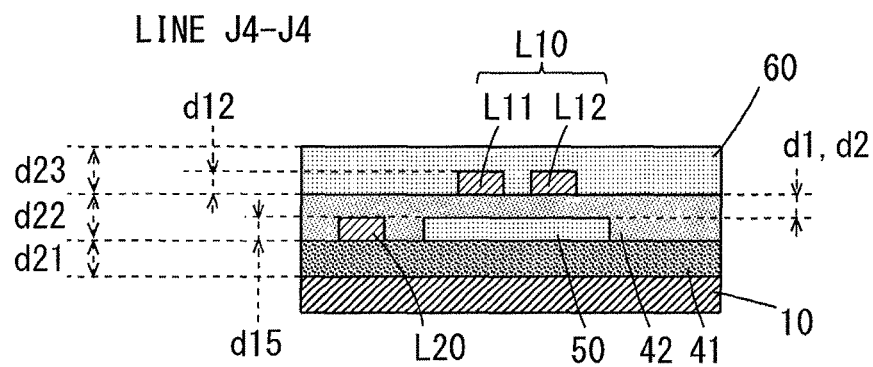
FIG. 32B is a cross sectional view taken along the line J4-J4 of FIG. 32A.

FIG. 32A is a plan view of a suspension board of the comparative example 1, and FIG. 32B is a cross sectional view taken along the line J4-J4 of FIG. 32A. In FIG. 32A, similarly to the example of FIG. 30A, part of constituent elements among a plurality of constituent elements of the suspension board is indicated by different display patterns, and other constituent elements are not shown. The suspension board of the comparative example 1 has the same configuration as that of the suspension board of the inventive example 1 except for the following points.

As shown in FIGS. 32A and 32B, in the suspension board of the comparative example 1, a ground layer 50 is not formed to come into contact with an upper surface of a support substrate 10. A first insulating layer 41 is formed to have a constant thickness and cover the entire upper surface of the support substrate 10. The ground layer 50 is formed on the first insulating layer 41 together with a lower wiring trace L20. A distance d1 between the ground layer 50 and each of lines L11, L12 in the substrate stacking direction is 4 µm. In the present comparative example 1, the distance d1 between the ground layer 50 and each of the lines L11, L12 in the substrate stacking direction is equal to a distance d2 between a lower wiring trace L20 and each of lines L11, L12 in the substrate stacking direction. In the suspension board of the comparative example 1, the aperture ratio is set to 0%.

Figure 33A:
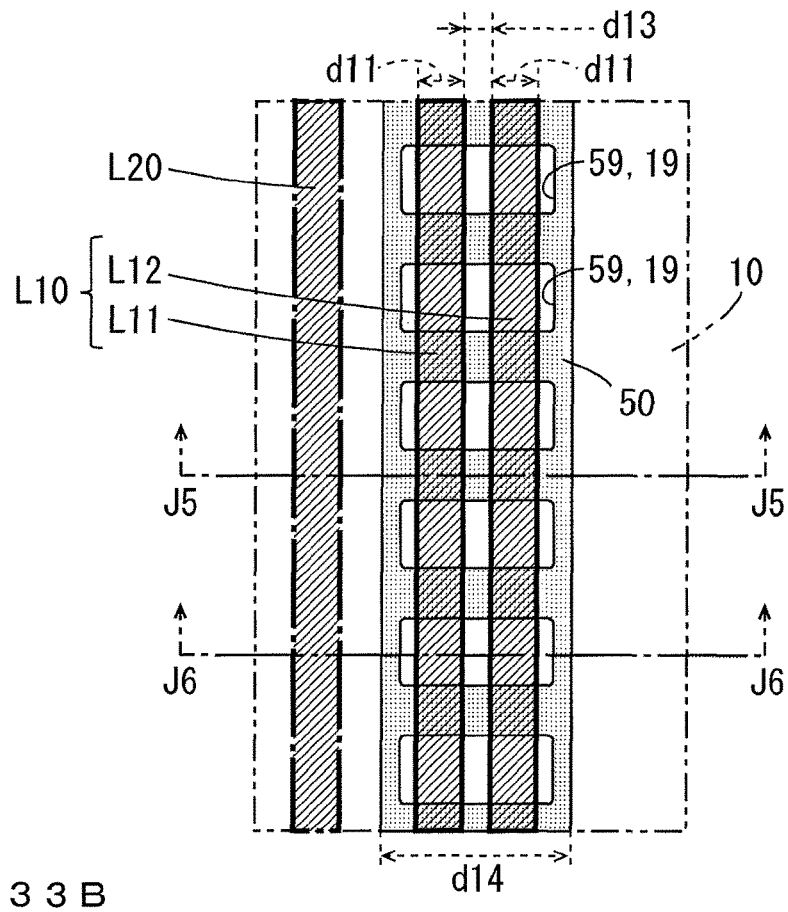
FIG. 33A is a plan view of a suspension board of a comparative example 2.
Figure 33A:
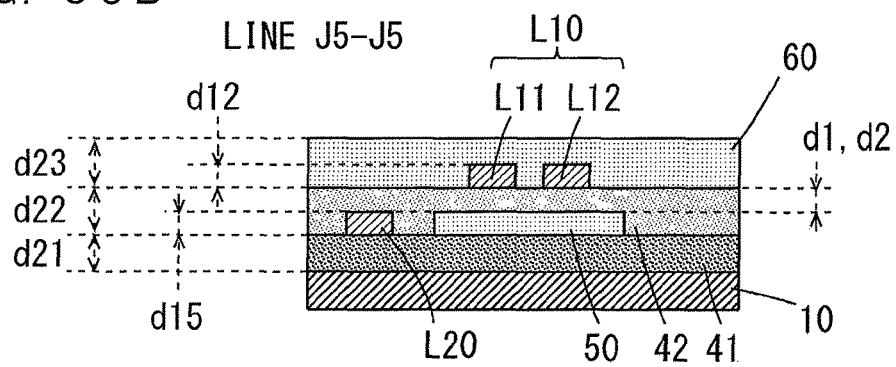
Figure 33A:
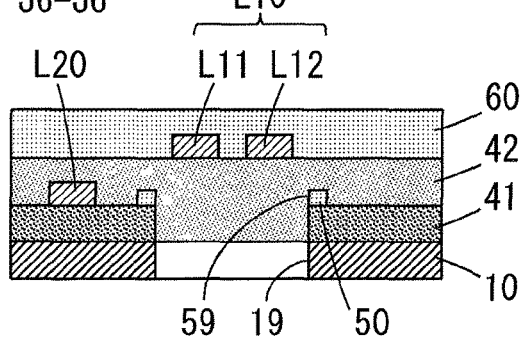

FIG. 33A is a plan view of a suspension board of the comparative example 2, FIG. 33B is a cross sectional view taken along the line J5-J5 of FIG. 33A, and FIG. 33C is a cross sectional view taken along the line J6-J6 of FIG. 33A. In FIG. 33A, similarly to the example of FIG. 30A, part of constituent elements among a plurality of constituent elements of the suspension board is indicated by different display patterns, and the other constituent elements are not shown. The suspension board of the comparative example 2 has the same configuration as that of the suspension board of the comparative example 1 except for the following points.

As shown in FIGS. 33A to 33C, in the suspension board of the comparative example 2, a plurality of first openings 19 are intermittently formed to be arranged in one direction in portions of a support substrate 10 overlapping with an upper wiring trace L10 similarly to the suspension board of the inventive example 2. Further, a plurality of second openings 59 are formed in portions of a ground layer 50 overlapping with the upper wiring trace L10 to respectively overlap with the plurality of first openings 19. In the suspension board of the comparative example 2, the aperture ratio is set to 50%.

The dimension of each portion of the suspension board of each of the inventive examples 1, 2 and the comparative examples 1, 2 is shown in the Table 1, described below.

TABLE 1

| | INVENTIVE EXAMPLE 1 | INVENTIVE EXAMPLE 2 | COMPARATIVE EXAMPLE 1 | COMPARATIVE EXAMPLE 2 |
|---|---|---|---|---|
| LENGTH OF EACH OF UPPER WIRING TRACE AND LOWER WIRING TRACE | 20 mm | 20 mm | 20 mm | 20 mm |
| WIDTH OF EACH OF UPPER WIRING TRACE AND LOWER WIRING TRACE | 80 µm | 80 µm | 80 µm | 80 µm |
| THICKNESS OF EACH OF UPPER WIRING TRACE AND LOWER WIRING TRACE | 4 µm | 4 µm | 4 µm | 4 µm |
| DISTANCE BETWEEN TWO LINES OF UPPER WIRING TRACE | 20 µm | 20 µm | 20 µm | 20 µm |
| WIDTH OF GROUND LAYER | 300 µm | 300 µm | 300 µm | 300 µm |
| THICKNESS OF GROUND LAYER | 4 µm | 4 µm | 4 µm | 4 µm |
| THICKNESS OF FIRST INSULATING LAYER | 8 µm | 8 µm | 8 µm | 8 µm |
| THICKNESS OF SECOND INSULATING LAYER | 8 µm | 8 µm | 8 µm | 8 µm |
| THICKNESS OF THIRD INSULATING LAYER | 12 µm | 12 µm | 12 µm | 12 µm |

TABLE 1-continued

| | INVENTIVE EXAMPLE 1 | INVENTIVE EXAMPLE 2 | COMPARATIVE EXAMPLE 1 | COMPARATIVE EXAMPLE 2 |
|---|---|---|---|---|
| APERTURE RATIO | 0% | 50% | 0% | 50% |
| DISTANCE BETWEEN GROUND LAYER AND UPPER WIRING TRACE | 12 μm | 12 μm | 4 μm | 4 μm |
| DISTANCE BETWEEN LOWER WIRING TRACE AND UPPER WIRING TRACE | 4 μm | 4 μm | 4 μm | 4 μm |

An S parameter Sdd21, which indicates transmission characteristics in me case where an electric signal is transmitted through the upper wiring trace L10 of each of the inventive examples 1, 2 and the comparative examples 1, 2, was found by simulation. The S parameter Sdd21 indicates an attenuation amount in a differential mode input and a differential mode output.

Figure 34:
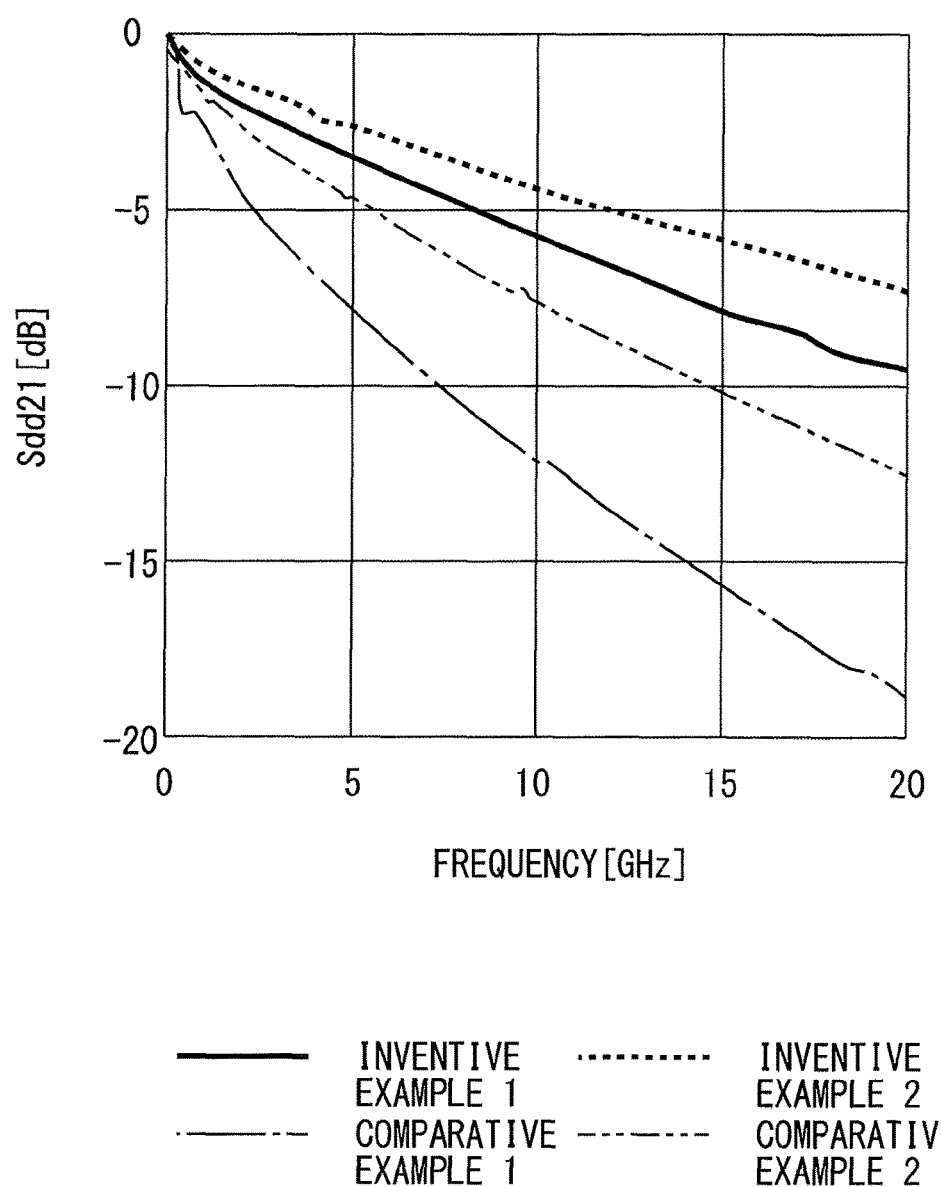
FIG. 34 is a diagram showing results of simulation relating to the suspension board of each of the inventive examples 1, 2 and the comparative examples 1, 2.

FIG. 34 is a diagram showing results of simulation relating to the suspension boards of the inventive examples 1, 2 and the comparative examples 1, 2. In FIG. 34, the ordinate indicates the S parameter Sdd21 [dB], and the abscissa indicates a frequency [GHz] of an electric signal. Further, in FIG. 34, the results of simulation relating to the inventive examples 1, 2 are indicated by a thick solid line and a thick dotted line, respectively. The results of simulation relating to the comparative examples 1, 2 are indicated by a one-dot and dash line and a two-dots and dash line, respectively.

In FIG. 34, a negative gain indicated by the ordinate represents the loss. Therefore, it is indicated that, the lower the value of the S parameter Sdd21 is, the larger the attenuation amount is. Further, it is indicated that, the closer the value of the S parameter Sdd21 is to 0, the smaller the attenuation amount is.

According to the results of simulation of FIG. 34, in a frequency band from 0 to 20 GHz, an attenuation amount of an electric signal transmitted in the suspension board of the inventive example 1 is smaller than an attenuation amount of an electric signal transmitted in the suspension board of each of the comparative examples 1, 2. Thus, it was found that, when the distance d1 between the ground layer 50 and each of the lines L11, L12 was larger than the distance d2 between the lower wiring trace L20 and each of the lines L11, L12 in the substrate stacking direction, an attenuation amount of an electric signal could be reduced over wide frequency bands.

Further, according to the results of simulation of FIG. 34, in the frequency band from 0 to 20 GHz, an attenuation amount of an electric signal transmitted in the suspension board of the inventive example 2 is even smaller than the attenuation amount of the electric signal transmitted in the suspension board of the inventive example 1. Thus, it was found that, when the aperture ratio was set to a large value, an attenuation amount of an electric signal could be reduced over wide frequency bands.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

We claim:

1. A printed circuit board comprising:
a support substrate formed of a conductive material;
a ground layer that is formed directly on the support substrate and has electric conductivity higher than that of the support substrate;
a first insulating layer formed on the support substrate;
a lower wiring trace formed on the first insulating layer;
a second insulating layer formed on the first insulating layer to cover the ground layer and the lower wiring trace; and
an upper wiring trace formed on the second insulating layer to overlap with the ground layer, wherein
a distance between the ground layer and the upper wiring trace is larger than a distance between the lower wiring trace and the upper wiring trace in a stacking direction of the support substrate, the first insulating layer and the second insulating layer,
the first insulating layer is formed in a region on the support substrate in which the ground layer is not formed, and
the second insulating layer is in contact with the ground layer.

2. The printed circuit board according to claim 1, wherein the first insulating layer has a portion extending between the ground layer and the second insulating layer, and the extending portion is formed to come into contact with the ground layer.

3. The printed circuit board according to claim 1, further comprising:
a relay trace formed on the first insulating layer; and
first and second vias that penetrate the second insulating layer, wherein
the upper wiring trace includes first and second signal lines that constitute a signal line pair,
the first signal line includes first and second branch lines,
the second signal line includes third and fourth branch lines electrically connected to each other,
the first and second branch lines of the first signal line and the third and fourth branch lines of the second signal line are arranged such that any one of the first and second branch lines is positioned between the third and fourth branch lines, and are arranged such that any one of the third and fourth branch lines is positioned between the first and second branch lines,
the first via electrically connects part of the first branch line of the first signal line to the relay trace, and
the second via electrically connects a remaining portion of the first branch line of the first signal line to the relay trace.

4. The printed circuit board according to claim 1, wherein the support substrate includes stainless steel, and the ground layer includes copper.

5. The printed circuit board according to claim 1, further comprising a third insulating layer formed on the second insulating layer to cover the upper wiring trace.

6. A printed circuit board comprising:
a support substrate formed of a conductive material;
a ground layer that is formed on the support substrate and has electric conductivity higher than that of the support substrate;
a first insulating layer formed on the support substrate;
a lower wiring trace formed on the first insulating layer;
a second insulating layer formed on the first insulating layer to cover the ground layer and the lower wiring trace;
an upper wiring trace formed on the second insulating layer to overlap with the ground layer;
a first opening formed in the support substrate; and
a second opening overlapping with the first opening of the support substrate formed in the ground layer;
wherein the upper wiring trace at least partially overlaps with the second opening of the ground layer, and
wherein a distance between the ground layer and the upper wiring trace is larger than a distance between the lower wiring trace and the upper wiring trace in a stacking direction of the support substrate, the first insulating layer and the second insulating layer.

7. The printed circuit board according to claim 6, wherein the first and second openings are formed such that, in the case where the printed circuit board is viewed in the stacking direction, an inner edge of the second opening surrounds an inner edge of the first opening, and
the inner edge of the second opening is covered by the first or second insulating layer.

8. The printed circuit board according to claim 6, wherein the upper wiring trace extends in a first direction, and
a plurality of the second openings are intermittently formed in the ground layer to be arranged in the first direction.

9. A printed circuit board comprising:
a support substrate formed of a conductive material;
a ground layer that is formed on the support substrate and has electric conductivity higher than that of the support substrate;
a first insulating layer formed on the support substrate;
a lower wiring trace formed on the first insulating layer;
a second insulating layer formed on the first insulating layer to cover the ground layer and the lower wiring trace;
an upper wiring trace formed on the second insulating layer to overlap with the ground layer; and
first and second vias that penetrate at least one of the first and second insulating layers, wherein
a distance between the ground layer and the upper wiring trace is larger than a distance between the lower wiring trace and the upper wiring trace in a stacking direction of the support substrate, the first insulating layer and the second insulating layer,
the support substrate includes a support portion electrically connected to the ground layer and a wiring portion electrically insulated from the support portion,
the upper wiring trace includes first and second signal lines that constitute a signal line pair,
the first signal line includes first and second branch lines,
the second signal line includes third and fourth branch lines electrically connected to each other,
the first and second branch lines of the first signal line and the third and fourth branch lines of the second signal line are arranged such that any one of the first and second branch lines is positioned between the third and fourth branch lines, and are arranged such that any one of the third and fourth branch lines is positioned between the first and second branch lines,
the first via electrically connects part of the first branch line of the first signal line to the wiring portion of the support substrate, and
the second via electrically connects a remaining portion of the first branch line of the first signal line to the wiring portion of the support substrate.

10. A method of manufacturing a printed circuit board including the steps of:
forming a ground layer having electric conductivity higher than that of a support substrate directly on the support substrate, the support substrate being formed of a conductive material;
forming a first insulating layer in a region on the support substrate in which the ground layer is not formed;
forming a lower wiring trace on the first insulating layer;
forming a second insulating layer on the first insulating layer to cover the ground layer and the lower wiring trace, the second insulating layer being in contact with the ground layer; and
forming an upper wiring trace on the second insulating layer to overlap with the ground layer, wherein
the steps of forming the ground layer and the lower wiring trace include forming the ground layer and the lower wiring trace such that a distance between the ground layer and the upper wiring trace is larger than a distance between the lower wiring trace and the upper wiring trace in a stacking direction of the support substrate, the first insulating layer and the second insulating layer.

11. The method of manufacturing the printed circuit board according to claim 10, wherein the step of forming the first insulating layer includes forming the first insulating layer to extend between the ground layer and the second insulating layer and come into contact with the ground layer.

* * * * *